(12) United States Patent
Thomann et al.

(10) Patent No.: US 6,763,444 B2
(45) Date of Patent: Jul. 13, 2004

(54) READ/WRITE TIMING CALIBRATION OF A MEMORY ARRAY USING A ROW OR A REDUNDANT ROW

(75) Inventors: Mark R. Thomann, Boise, ID (US); Christopher K. Morzano, Boise, ID (US); Wen Li, Boise, ID (US)

(73) Assignee: Micron Technology, Inc., Boise, ID (US)

(*) Notice: Subject to any disclaimer, the term of this patent is extended or adjusted under 35 U.S.C. 154(b) by 337 days.

(21) Appl. No.: 09/851,176

(22) Filed: May 8, 2001

(65) Prior Publication Data
US 2002/0169922 A1 Nov. 14, 2002

(51) Int. Cl.[7] .............................................. G06F 12/00
(52) U.S. Cl. ..................... 711/170; 711/100; 702/89; 713/401; 713/503
(58) Field of Search ................................. 711/100, 170; 702/89; 713/401, 503

(56) References Cited

U.S. PATENT DOCUMENTS

| 5,235,699 A | 8/1993 | Shaffer et al. |
| 5,386,392 A | 1/1995 | Cantiant et al. |
| 5,485,490 A | 1/1996 | Leung et al. |
| 5,577,236 A | 11/1996 | Johnson et al. |
| 5,953,284 A | 9/1999 | Baker et al. |
| 6,005,813 A | 12/1999 | Waller et al. |
| 6,026,050 A | 2/2000 | Baker et al. |
| 6,029,250 A | 2/2000 | Keeth |
| 6,151,270 A * | 11/2000 | Jeong ........................... 365/233 |
| 6,366,507 B1 * | 4/2002 | Akioka et al. ............... 365/194 |
| 6,484,232 B2 * | 11/2002 | Olarig et al. ................ 711/105 |
| 6,493,836 B2 * | 12/2002 | Olarig et al. .................. 714/42 |
| 6,560,725 B1 * | 5/2003 | Longwell et al. .............. 714/54 |
| 6,587,804 B1 * | 7/2003 | Johnson et al. ............. 702/107 |
| 6,590,815 B2 * | 7/2003 | Mine .......................... 365/200 |

FOREIGN PATENT DOCUMENTS

| EP | 0 707 268 A2 | 4/1996 |
| EP | 0 897 154 A2 | 2/1999 |

* cited by examiner

Primary Examiner—Mano Padmanabhan
Assistant Examiner—Paul Baker
(74) Attorney, Agent, or Firm—TraskBritt

(57) ABSTRACT

A number of embodiments of memory devices and methods of performing read/write timing calibration of these memory devices using a row or a redundant row. Addressing of the row or redundant row in a memory array of a memory device may be accomplished by using a calibration fuse bank to address a row or a redundant row of the memory array, by using a fuse bank of the memory device to address a redundant row of the memory array, or by storing the row address of a row in a memory controller and providing the row address to the memory device during calibration. A redundant row used for calibration may be a redundant row not utilized by a memory device during repair of its memory array. A row used for calibration may be a row not utilized by a memory device due to the nature of the specific application in which that memory device is being used. A unique data pattern may then be written to and read from the addressed row or redundant row for read/write timing calibration. Use of a nonutilized row or redundant row for read/write timing calibration according to the present invention enables calibration to be performed during operation of a memory device without compromising data integrity.

49 Claims, 7 Drawing Sheets

READ/WRITE TIMING CALIBRATION OF A MEMORY ARRAY USING A ROW OR A REDUNDANT ROW

BACKGROUND OF THE INVENTION

1. Field of the Invention

The present invention relates generally to integrated circuit memory storage devices. Specifically, the present invention relates to a method for performing read/write timing calibration of a memory array, such as a dynamic random access memory array and, specifically, to a method of conducting read/write timing calibration of a memory array using a row or a redundant row.

2. State of the Art

A conventional computer system typically includes a processor coupled to one or more memory devices via a memory controller. During operation of such a computer system, the processor regularly exchanges information— i.e., data bits—with the memory devices. Generally, the processor is capable of processing information at a rate greatly exceeding the rate at which the memory devices are capable of transmitting information to and from the processor. Thus, in conventional computer systems, the maximum speed at which the processor can operate is restricted, not by the processor's inherent processing limitations, but by the rate at which data can be written to the memory devices and the rate at which data can be read from the memory devices.

A conventional memory device, such as a dynamic random access memory ("DRAM") device, typically includes a memory array comprising a plurality of memory cells arranged in rows and columns. Generally, to write a data bit into a specified memory cell of the memory array, the memory controller provides the data bit to the memory device in response to an internal clock signal and the data bit is retained in the memory device at an input buffer. In response to a data clock signal provided to the memory device by the memory controller, the data bit is latched into the memory array. For reliable transfer of data to the memory array, there must be a sufficient time delay between the internal clock of the memory controller and the data clock signal, such that sampling of the data bit at the input buffer occurs during a time window in which that data bit is valid—i.e., the data valid window. Similarly, to read a data bit out of a specified memory cell of the memory array, the data bit is latched from the memory array to an output buffer in response to a data clock signal provided to the memory device by the memory controller. Subsequently, the data bit is latched into the memory controller in response to the memory controller's internal clock. Again, to insure that the data bit is sampled by the memory controller during its data valid window, a sufficient time delay between the data clock signal and the internal clock signal of the memory controller must be provided.

Although memory architectures having the ability to compensate for the slower operating speed of the memory devices—by using, for example, cache memory—are known in the art, memory device manufacturers are under increasing pressure to produce memory devices capable of operating at ever-increasing speeds, or clock rates, especially in light of high-frequency processors now available in the market. Thus, memory device manufacturers are now producing memory devices capable of operating at clock rates up to 500 MHz and higher. One problem encountered by memory device manufacturers in regard to these high-frequency memory devices is reliable data transfer. Specifically, when a data bit is to be read out of a memory device, for example, the data bit must be sampled by the memory controller while that data bit is valid. In other words, the clock delay between the data clock signal and the internal clock signal of the memory controller must be carefully selected to insure data sampling occurs during the data valid window.

One method known in the art for insuring reliable data transfer to and from a memory device is to provide a guaranteed setup and hold time. During a read operation, for example, guaranteed setup and hold comprises insuring a data bit is held or made available for a finite time window after the time at which the data bit has been latched out of the memory array to the output buffer to insure the data bit is available when sampling by the memory controller occurs—i.e., the "setup time"—and also providing a finite time window after the time at which the data bit was latched out of the memory array during which sampling of the data bit by the memory controller must occur to insure the data bit is sampled before another data bit is latched to the output buffer—i.e., the "hold time." Thus, the guaranteed setup and hold method insures, at least for lower clock rates, that data is sampled during its data valid window. However, for high-frequency memory applications, providing a guaranteed setup time and hold time becomes impractical.

Another method known in the art for providing reliable data transfer to and from a memory device is to calibrate a memory device or a plurality of memory devices, a process commonly referred to as "read/write timing calibration." One conventional method of calibrating a memory device is to construct a plurality of dedicated registers on each input/output line, or DQ line, of a memory device. A known, unique data pattern is written into the dedicated registers at a slow rate to insure reliable data transfer. The unique data pattern is then read out of the dedicated registers at a fast rate and the unique data pattern is compared to the known data pattern to see if any error occurred. If no error has occurred, the speed at which data is read out is increased and, if an error is detected, the speed at which data is read out is decreased. Calibration is continued until an optimum data transfer rate is determined. Although the above-described calibration method may be suitable for determining optimum data transfer rates at high-frequency, the addition of a plurality of dedicated registers to each DQ line of a memory device consumes surface area on a memory device and, thus, places a high "real estate cost" on the memory device. Further, the unique data pattern is limited in length by the number of dedicated registers available.

Accordingly, there is a need in the art for a method of performing read/write timing calibration and determining optimum data transfer rates for high-speed memory applications and, specifically, there is a need for such a method of performing read/write timing calibration that does not require dedicated calibration registers or other components and, hence, that does not consume valuable "real estate" on the surface of a memory device.

SUMMARY OF THE INVENTION

The present invention encompasses a number of embodiments of memory devices and methods of performing read/write timing calibration of these memory devices using a row or a redundant row. Use of a nonutilized row or redundant row for read/write timing calibration according to the present invention enables calibration to be performed during operation of a memory device without compromising data integrity. Further advantages include reliable calibration, minimal or nonexistent "real estate costs," and simplicity resulting from the by-passing of address decoding.

In one embodiment of the present invention, a calibration fuse bank is provided on a memory device and the calibration fuse bank is programmed with the redundant rows not being utilized by the memory device for repair of its memory array. During read/write timing calibration, the calibration fuse bank is used to address a nonutilized redundant row of the memory array, and a unique data pattern can be written into and read out from this redundant row during calibration. In a further embodiment, the calibration fuse bank addresses a row or a nonutilized row of the memory array to be used for calibration.

In another embodiment of the present invention, the fuse bank of a memory device is used to identify and address a redundant row of the memory device not being utilized for repair of its memory array. Nonutilized redundant rows are identified by looking for fuses within the fuse bank that have not been blown (i.e., not programmed with a redundant row used for repair). During read/write timing calibration, the nonblown fuses in the fuse bank are used to address a nonutilized redundant row of the memory array, and a unique data pattern can be written into and read out from this redundant row for calibration.

In yet another embodiment of the present invention, a memory controller or processor is programmed with the row addresses of the row or rows of a memory array that are to be used for calibration. The row or rows used for calibration may be a row of the memory array or, alternatively, a row of the memory array selected from a group of rows not being used by the memory array for a specific application. During calibration, a calibration command is provided to the memory device directing an address decoder to address one of the rows or nonutilized rows of a memory array for read/write timing calibration. A unique data pattern can then be written into and read out from the addressed row for read/write timing calibration.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

Figure 1:
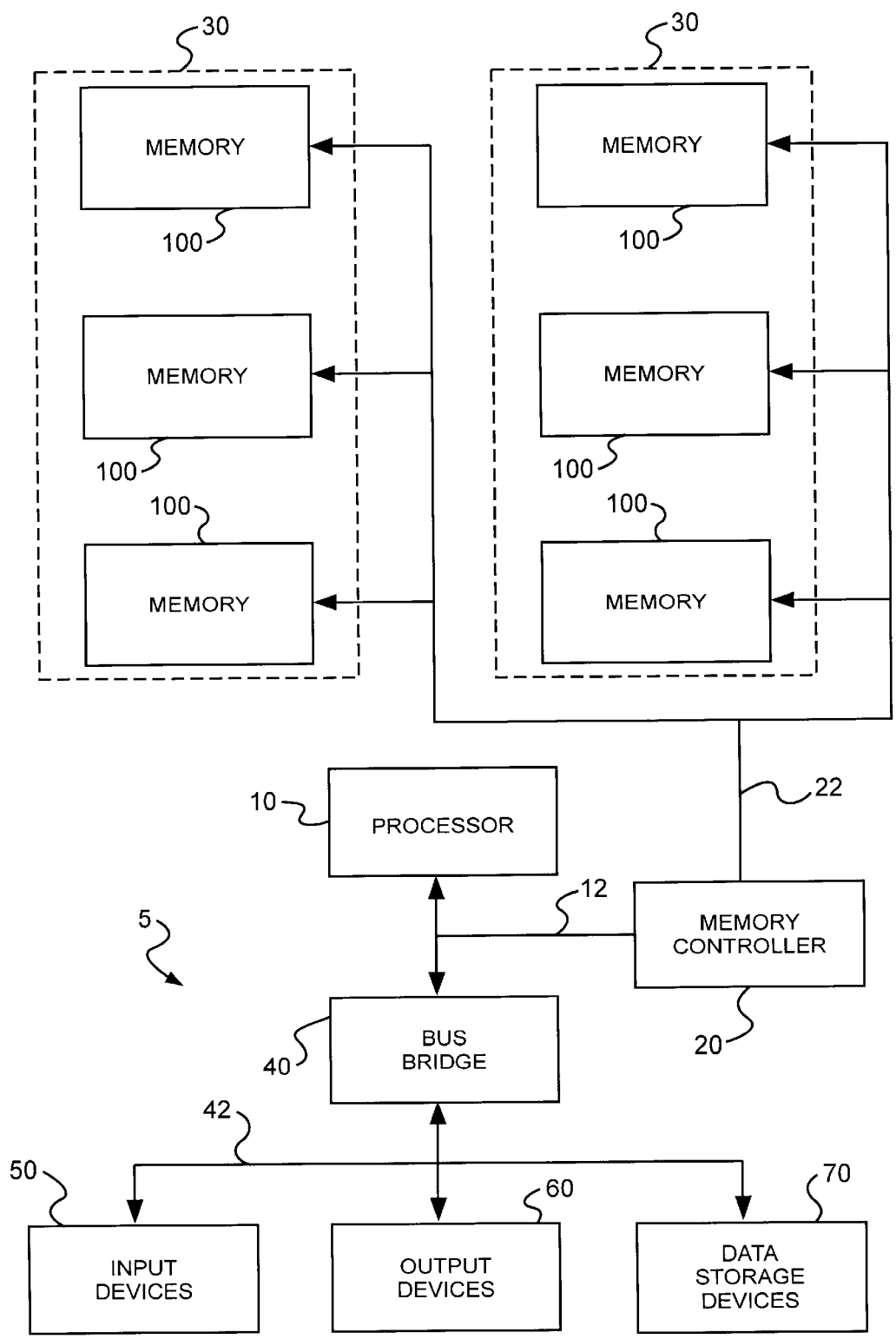
FIG. 1 is a schematic view of an exemplary embodiment of a conventional computer system.

Shown schematically in FIG. 1 is an exemplary embodiment of a conventional computer system 5. The computer system 5 includes a processor 10 coupled via a processor bus 12 to a memory controller 20. A memory bus 22 couples one or more memory devices 100 to the memory controller 20. Further, a plurality of the memory devices 100 may comprise a memory module 30, such as a single in-line memory module ("SIMM") or a dual in-line memory module ("DIMM"). Although shown as separate elements, those of ordinary skill in the art will appreciate that the processor 10 and memory controller 20 may comprise a single, integrated system.

The memory device or devices 100 may comprise, for example, dynamic random access memory ("DRAM") devices. Although a DRAM device may be asynchronous— i.e., it operates at a clock rate independent of the clock used by the memory controller 20 (or processor 10)—a DRAM device is typically synchronous—i.e., it operates in synchronization with a clock signal or signals provided by the memory controller 20 (and may also employ fast cache memory to hold commonly used data). Also, a DRAM device may utilize synchronous link architecture, wherein the DRAM device is configured to receive "packetized" command and address data rather than bifurcated command and address signals. Further, a DRAM device may utilize double data rate ("DDR") technology, wherein data is latched into or out of the memory array of a DRAM device on both the leading edge and trailing edge of a clock signal.

Coupled to the processor 10 is a bus bridge 40, which is electrically connected to the processor 10 by the processor bus 12. The computer system 5 includes one or more input devices 50, such as a keyboard or mouse, coupled to the processor 10 through the bus bridge 40 and an expansion bus 42. The expansion bus 42 may comprise, by way of example, an industry standard architecture ("ISA") bus or a peripheral component interconnect ("PCI") bus. Also, coupled to the processor 10 via the bus bridge 40 and expansion bus 42 are one or more output devices 60. Typical output devices 60 used with conventional computer systems include printers and display monitors. The computer system 5 further includes one or more data storage devices 70 coupled to the processor 10 via the bus bridge 40 and expansion bus 42. Common data storage devices include hard disk drives, floppy disk drives, and CD ROM drives.

The memory bus 22 is configured for transferring data between the memory controller 20 and the memory devices 100. For example, if data is to be read from a memory device 100, the data is transferred from the memory device 100 over the memory bus 22 and to the memory controller 20, which subsequently transfers the data to the processor 10 via processor bus 12. Similarly, if data is to be written to a memory device 100, the processor 10 transfers the data over the processor bus 12 to the memory controller 20, which, in turn, transfers the data to a specified memory device 100. The memory bus 22 is also configured to send command signals and address data to the memory device or devices 100. The memory devices 100 may also receive one or more clock signals over the memory bus 22, the clock signals being provided by the processor 10, memory controller 20, or another component of the computer system 5, as desired.

It will be understood by those of ordinary skill in the art that a conventional computer system may include other components and subsystems in addition to those shown and described with respect to FIG. 1. By way of example, the conventional computer system 5 shown in FIG. 1 may include video memory, cache memory, as well as other dedicated memory, and additional signal lines and buses.

Figure 2:
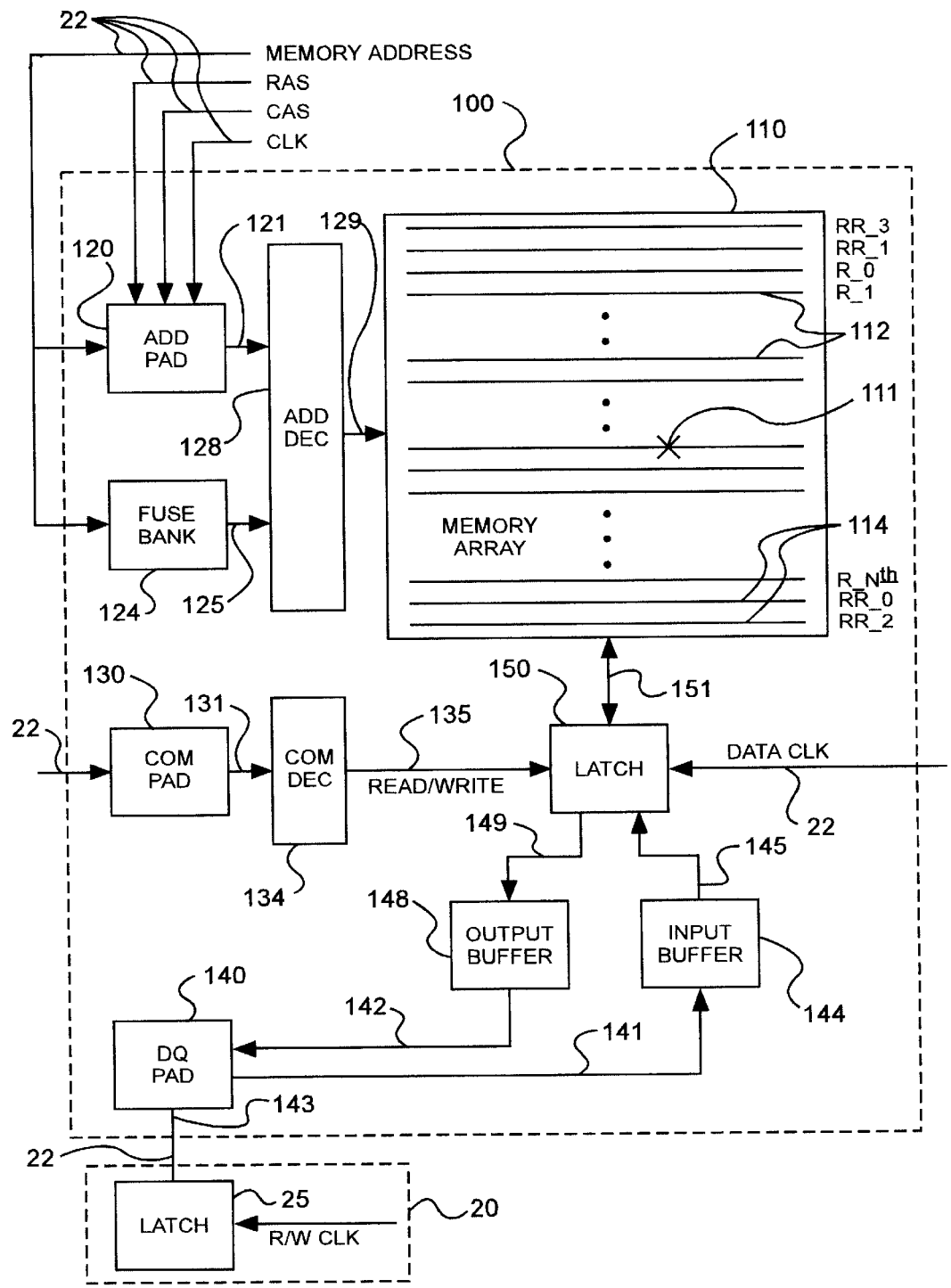
FIG. 2 is a schematic view of an exemplary embodiment of a conventional memory device.

Shown schematically in FIG. 2 is an exemplary embodiment of a conventional memory device 100, such as a synchronous DRAM device. The memory device 100 includes a memory array 110 comprising a plurality of memory cells 111 arranged in rows 112 (i.e., R_0, R_1, ..., R_N$^{th}$) and columns (not shown). The memory array 1 10 may also include a plurality of redundant rows 114 (i.e., RR_0, RR_1, RR_2, RR_3) of memory cells 11 1 or a plurality of redundant columns (not shown) of memory cells 111. Although the memory device 100 is depicted as including a unitary memory array, it will be understood by those of ordinary skill in the art that a memory device 100 may include a memory array 110 comprising two or more subarrays, each subarray including a plurality of memory cells arranged in rows and columns, as well as a plurality of redundant rows or redundant columns of memory cells.

Typically, each memory cell 111 in the memory array 110 comprises a transistor and a capacitor configured to hold a desired charge and to output a specified voltage when the memory cell 111 is accessed or activated, or to hold substantially no charge and to output approximately zero voltage when accessed or activated. Thus, each memory cell 111 is capable of storing digital information in the form of a "1" (high) or "0" (low) bit. Because the charge stored on the capacitor will decay or leak away over time, the memory cells 111 must be periodically refreshed to restore the charge to the capacitor of each memory cell 111.

The memory device 100 also includes an address pad 120 configured for receiving memory address ("MEMORY ADDRESS") data, as well as row access strobe ("RAS") and column access strobe ("CAS") signals, over memory bus 22 from the memory controller 20. A MEMORY ADDRESS identifies a specified memory cell 111 of the memory array 110 according to that memory cell's row 112 (i.e., the "row address") and column (i.e., the "column address"). The address pad 120 may receive MEMORY ADDRESS data in synchrony with, or in response to, a clock ("CLK") signal, the CLK signal being provided over memory bus 22 from the memory controller 20. Also, the RAS and CAS signals may be "tied" to the CLK signal, such that the RAS and CAS signals are derived or generated from the CLK signal.

As used herein, the term "signal" means any electrical signal of any suitable pulse shape, the pulse shape typically including a leading edge and a trailing edge. Further, as used herein, the term "signal" may denote an electrical signal comprising any suitable number of pulses, such as, for example, a single electrical pulse or a plurality of electrical pulses.

An address decoder 128 is coupled to the address pad 120 by an electrical conductor or conductors 121. The address decoder 128 receives MEMORY ADDRESS data from the address pad 120 and decodes the row and column address data such that the appropriate cell 111 of memory array 110 can be selected or activated. The address decoder 128 is coupled to the memory array 110 by one or more electrical conductors 129. Also, a fuse bank 124, or a plurality thereof, configured to receive MEMORY ADDRESS data from memory bus 22 is coupled to the address decoder 128 by an electrical conductor or conductors 125. The fuse bank 124 includes a plurality of programmable fuses or any other suitable, nonvolatile programmable elements known in the art. The function of the fuse bank or banks 124 will be explained in greater detail below.

The memory device 100 also includes a command pad 130 configured to receive command signals over memory bus 22 from the memory controller 20. A command decoder 134 is coupled via an electrical conductor or conductors 131 to the command pad 130. The command decoder 134 receives the command signals from the command pad 130 and decodes the command signals. Examples of command signals include read ("READ") and write ("WRITE"). The command pad 130 may be configured to receive command signals from the memory controller 20 in synchrony with, or in response to, the CLK signal.

The memory device 100 further includes a data pad, or DQ pad, 140 having a data input/output port, or DQ line, 143 for receiving data via memory bus 22 from the memory controller 20 and for sending data via memory bus 22 to the memory controller 20. The memory controller 20 includes at least a latch 25 for latching data into and out of the DQ pad 140. The DQ pad 140 is coupled via an electrical conductor or conductors 141 to an input buffer 144, which, in turn, is coupled to a latch 150 by an electrical conductor or conductors 145. The DQ pad 140 is also coupled via an electrical conductor or conductors 142 to an output buffer 148, the output buffer 148 also being coupled to the latch 150 by an electrical conductor or conductors 149. Latching of data bits into and out of the memory array 110 by the latch 25 of memory controller 20 is controlled by an internal clock signal of the memory controller 20, this internal clock signal being referred to herein as the read/write clock ("R/W CLK") signal. The R/W CLK signal may be "tied" to the CLK signal of the memory controller 20, such that the R/W CLK signal is generated or derived from the CLK signal.

The latch 150, which is coupled to the memory array 110 by one or more electrical conductors 151, is configured to receive data from the input buffer 144 and to write that data to a specified memory cell or cells 111 of the memory array 110. The latch 150 is further configured to retrieve data from a specified memory cell or cells 111 of the memory array 110 and to provide that data to the output buffer 148. Transfer of data across the latch 150 is controlled by a data clock ("DATA CLK") signal provided by the memory controller 20. The DATA CLK signal may be "tied" to either one of the CLK and R/W CLK signals of the memory controller 20, such that the DATA CLK signal is generated or derived from the CLK signal or the R/W CLK signal.

Those of ordinary skill in the art will understand that a conventional memory device may include other components or subsystems in addition to those shown and described with respect to FIG. 2, which are omitted for clarity and ease of understanding. For example, the memory device 100 shown in FIG. 2 may further include sense amplifiers and additional logic circuitry.

Generally, to write a data bit to the memory array 110, the memory controller 20 transfers, or "latches," the data bit over the DQ line 143 to the DQ pad 140 in response to the R/W CLK signal received at the latch 25 of the memory controller 20. The memory controller 20 also sends a corresponding MEMORY ADDRESS to the address pad 120 and a command signal to the command pad 130, both of which may be clocked into the address pad 120 and command pad 130, respectively, in synchrony with the CLK signal. The DQ pad 140 transfers the data bit to the input buffer 144, where the data bit 144 is made available to, or held for, the latch 150.

The MEMORY ADDRESS includes a row address and a column address. At some finite time after the MEMORY ADDRESS signal is sent to, or clocked into, the address pad 120, the memory controller 20 provides a RAS signal to the address pad 120. Upon receipt of the RAS signal, the address pad 120 latches the row address portion of the MEMORY ADDRESS to the address decoder 128. Subsequently, the address decoder 128 decodes the row address portion of the MEMORY ADDRESS and selects the identified row of the memory array 110. At some finite time after selection of the specified row 112 in the memory array 110, the memory controller 20 provides a CAS signal to the address pad 120. The column address portion of the MEMORY ADDRESS is then latched to the address decoder 128, and the address decoder 128 subsequently decodes the column address portion of the MEMORY ADDRESS and selects the identified column of the memory array 110. Based on the row and column addresses, a specific memory cell 111 of the memory array 110 is activated.

The command pad 130 provides the command signal to the command decoder 134. The command decoder 134 decodes the command signal—which, in this instance, is a WRITE command—and provides the command signal via an electrical conductor or conductors 135 to the latch 150. At a specified time delay after the data bit is latched into the DQ pad 140 in response to the R/W CLK signal, the memory controller provides a DATA CLK signal to the latch 150. Upon receipt of the DATA CLK signal (and receipt of the WRITE command), the latch 150 samples the input buffer 144 and transfers or latches the data bit to the selected memory cell 111. The data bit is then stored in, or written to, the selected memory cell 111.

To read a data bit from a particular memory cell 111 of the memory array 110, the memory controller 20 sends a corresponding MEMORY ADDRESS to the address pad 120 and a command signal to the command pad 130. Again, both the MEMORY ADDRESS signal and command signals may be clocked into the address pad 120 and command pad 130, respectively, in synchrony with the CLK signal. The MEMORY ADDRESS includes a row address and a column address.

Upon receipt of the MEMORY ADDRESS at the address pad 120, the memory controller 20 sends a RAS signal to the address pad 120 and the row address portion of the MEMORY ADDRESS is latched to the address decoder 128. Subsequently, the address decoder 128 decodes the row address portion of the MEMORY ADDRESS and selects the identified row 112 of the memory array 110. At some finite time after selection of the appropriate row 112 of the memory array 110, the memory controller 20 provides a CAS signal to the address pad 120 and the column address portion of the MEMORY ADDRESS is latched to the address decoder 128, which then decodes the column address and selects the identified column of the memory array 110. Based on the row and column addresses, a specific memory cell 111 of the memory array 110 is accessed, and the data bit stored in the specified memory cell 111 is made available to the latch 150.

The command pad 130 provides the command signal to the command decoder 134, which decodes the command signal and provides the command signal to the latch 150. In this instance, the command signal is a READ command. The memory controller 20 then provides a DATA CLK signal to the latch 150. Upon receipt of the DATA CLK signal (and the READ command), the latch 150 samples the selected memory cell 111 and the data bit stored in the selected memory cell 111 is then latched to, or read out to, the output buffer 148. The data bit can then be transmitted to the DQ pad 140, where the data bit is held for latching out of the memory device 100. At some specified time delay after the data bit is latched to the output buffer 148 in response to the DATA CLK signal, the memory controller 20 provides a R/W CLK signal to the latch 25, and the data bit is latched out of the memory device 100 on DQ line 143 and is then transmitted to the memory controller 20.

During a read operation, the specified time delay between receipt of the DATA CLK signal at the latch 150 and receipt of the R/W CLK signal at the latch 25 of the memory controller 20 is necessary to insure that the memory controller 20 does not sample a data bit at the DQ pad 140 until the appropriate data bit has been latched to the output buffer 148 and transferred to the DQ pad 140. A similar clock delay is required during a write operation between receipt of the R/W CLK signal at the latch 25 of memory controller 20 and receipt of the DATA CLK signal at the latch 150 to insure that latching of a data bit from the input buffer 144 does not occur prior to latching of the appropriate data bit from the memory controller 20 and arrival of the appropriate data bit at the input buffer 144. The time delay between sending of the DATA CLK signal to latch 150 by memory controller 20 and sending of the R/W CLK signal to latch 25 by memory controller 20 during a read operation, as well as the time delay between sending of the R/W CLK signal to latch 25 by memory controller 20 and sending of the DATA CLK signal to latch 150 by memory controller 20 during a write operation, will both be referred to herein as the "data clock delay." Generally, the data clock delay is set or determined by the memory controller 20.

If, during a read operation, the R/W CLK signal is received at the latch 25 of memory controller 20 prior to latching of the data bit to the output buffer 148 and transfer of that data bit to the DQ pad 140, the memory controller 20 will not sample the appropriate data bit at the DQ pad 140, or will sample no data bit. If the R/W CLK signal is received at the latch 25 too late in time, the memory controller 20 may not sample the correct data bit as another data bit may have already been latched to the output buffer 148 and transmitted to the DQ pad 140. Thus, when a data bit is latched to the output buffer 148 and transferred to the DQ pad 140, there exists a time window within which that data bit must be sampled by the memory controller 20 in order for that data bit to be reliably read out onto the DQ line 143 and provided to the memory controller 20. If the data bit is not sampled by the memory controller 20 within this time window— often referred to as the "data valid window"—that data bit may be lost. Additional read cycles may then be necessary to read out the lost data bit or bits, resulting in the inefficient transfer of data.

Similarly, during a write operation, if the DATA CLK signal is received at the latch 150 prior to latching of the data bit to the input buffer 144, an incorrect data bit or no data bit will be latched into the activated cell 111 of the memory array 110. If the DATA CLK signal is received at the latch 150 too late in time, the incorrect data bit may be latched into the activated memory cell 111 of the memory array 110, as another data bit may have already been latched into the input buffer 144 by the memory controller 20. In other words, a data bit must be latched into, or written to, an activated memory cell 111 of the memory array 110 during that data bit's data valid window. If a data bit is not written into the memory array 110 during its data valid window, that data bit may be lost and additional write cycles may then be needed to write the lost data bit into the memory array 110.

Although the read and write operations for the memory device 100 were described above in the context of accessing a single memory cell 111, as identified by a unique MEMORY ADDRESS, those of ordinary skill in the art will understand that such a memory device 100 may be adapted to function according to any one of a number of access modes well known in the art. For example, the memory device 100 may be adapted for use in a "page access mode," wherein several column addresses are sequentially provided for a single row address. In the page access mode, data bits may be read from, or written to, several memory cells 111 located in the single, selected row 112 prior to receipt of a new row address and selection of another row 112.

Further, the above-described read and write operations are only exemplary, and those of ordinary skill in the art will understand that read and write procedures may vary significantly depending upon a memory chip's architecture. As noted above, a memory device may include additional components other than those shown and described with respect to FIG. 2. Further, in lieu of (or in addition to) the CLK, RAS, CAS, R/W CLK, and DATA CLK signals, as well as the data clock delay, the timing and interaction between the various components of a memory device may be governed by other suitable clock architectures comprising one or more clock signals. Thus, for any given memory device, successful read and write operations may require a set of clock signals, as well as necessary delays between clock signals, differing, in whole or in part, from the clock architecture described herein.

Figure 3:
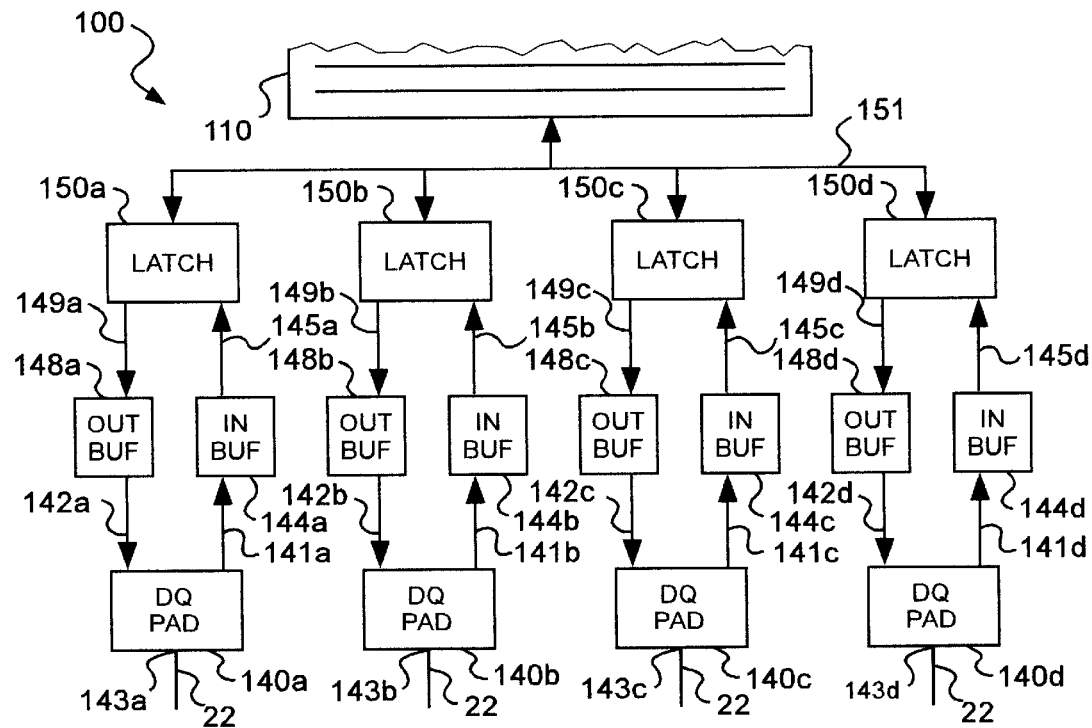
FIG. 3 is a schematic view of a further embodiment of a conventional memory device.

In the exemplary embodiment of a memory device 100 depicted in FIG. 2, only one DQ pad 140 is shown. However, as should be recognized by those of ordinary skill in the art, a memory device may include multiple DQ lines 143 for writing in and reading out data bits. For example, as shown in FIG. 3, the memory device 100 may include four DQ lines 143a–d for writing data bits into, and reading data bits out from, the memory array 110. Each DQ line 143a–d interfaces with a DQ pad 140a–d, respectively. The DQ pads 140a–d are connected by an electrical conductor or conductors 141a–d to corresponding input buffers 144a–d, which, in turn, are connected via an electrical conductor or conductors 145a–d to latches 150a–d, respectively. The DQ pads 140a–d are also connected by an electrical conductor or conductors 142a–d to corresponding output buffers 148a–d, and the output buffers 148a–d are connected by an electrical conductor or conductors 149a–d to their respective latches 150a–d, respectively. The latches 150a–d are connected to the memory array 110 by one or more conductors 151. Data is latched across each of the latches 150a–d in conjunction with a DATA CLK signal, as noted above. Thus, the memory device 100, as shown in FIG. 3, is capable of outputting or inputting four bits of data at a time.

Figure 4:
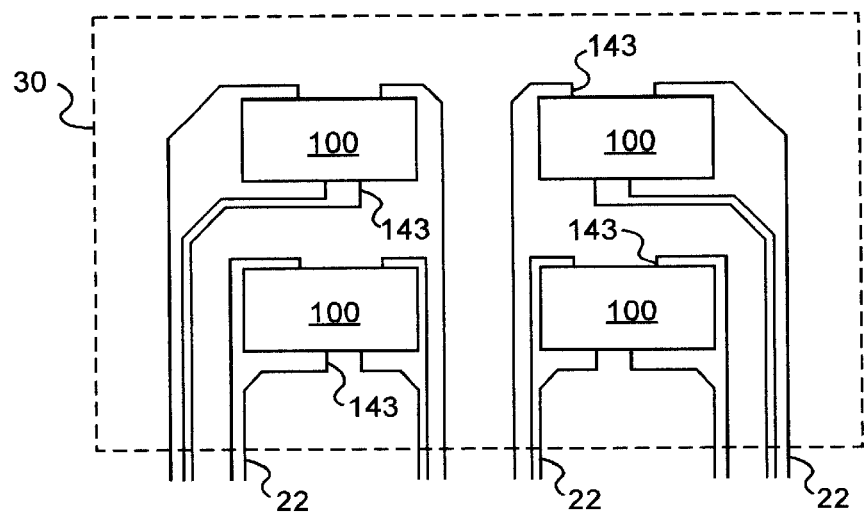
FIG. 4 is a schematic view of an exemplary embodiment of a conventional memory module.

Accordingly, the computer system 5 may include a memory module 30 having multiple DQ lines 143 connected to the memory bus 22, as shown in FIG. 4. For example, for a memory module 30 including four memory devices 100, each memory device 100 having four DQ lines 143a–d (as shown in FIG. 3), the memory module 30 will include sixteen DQ lines 143, as shown in FIG. 4.

As is shown in FIGS. 1 and 4, a conventional computer system 5 typically includes multiple memory devices 100. However, during a read or write operation, generally only one memory device 100 at a time is accessed to read or write data. In order to avoid the simultaneous access of memory cells 111 of multiple memory devices, and the subsequent transfer of multiple bits of data to the memory bus 22—a condition often referred to as "bus contention"—each memory device 100 may be assigned a unique identifier. Accordingly, during read and write operations, as described above, the memory controller 20 must send a command signal identifying the particular memory device 100 to which a data bit is to be read from or written to.

Semiconductor memory devices, such as DRAM devices, are typically tested after fabrication to determine if they contain any damaged or defective memory cells. Such damaged or defective memory cells may not operate reliably—i.e., data bits cannot be dependably written to a memory cell or data bits cannot be dependably read from a memory cell. When an inoperative memory cell, or a partially operative memory cell that does not meet performance specifications, is identified during testing, the memory array is repaired by, for example, replacing the failed memory cell with a redundant memory cell provided in a redundant row or a redundant column in the memory array. Redundant rows or redundant columns are additional rows or columns built into the memory array at the time of fabrication, but generally are not used by the memory array unless the memory array contains an inoperative memory cell requiring repair.

To repair a memory array, such as the memory array 110 shown in FIG. 2, containing a failed memory cell 111, the row 112 (or, optionally, the column) in which the failed memory cell 111 is located is stored in one or more of the nonvolatile, programmable elements of the fuse bank 124. The fuse bank 124 is configured to receive the MEMORY ADDRESS data from the memory controller 20 via memory bus 22, and the fuse bank 124 is also coupled to the address decoder 128 by an electrical conductor or conductors 125. During operation of the memory device 100, if the address pad 120 and fuse bank 124 receive a MEMORY ADDRESS including a row address (or, optionally, a column address) corresponding to a row address stored in the fuse bank 124, the fuse bank 124 sends a match signal to the address decoder 128 directing the address decoder 128 to select a redundant row 114 (or, optionally, a redundant column) rather than the row 112 including the failed memory cell 111.

Every row 112 of the memory array 110 containing a failed memory cell 111 is replaced by a redundant row 114, as described above. Although a memory array commonly includes one or more inoperative or partially inoperative memory cells, the number of redundant rows required to replace all failed memory cells in the memory array, and thereby to effect a repair of the memory array, is typically less than the total number of available redundant rows. Thus, at least some redundant rows (or, optionally, redundant columns) are routinely not utilized during repair of the memory array and are not used by the memory device during operation.

As is suggested by the above-described read and write operations, reliable data transfer to and from a memory device, such as the exemplary conventional memory device 100 shown in FIG. 2, requires precise and repeatable timing and operation of the various components of the memory device. Specifically, the data clock delay—i.e., the time delay between receipt of a DATA CLK signal at the latch 150 and receipt of a R/W CLK signal at the latch 25 during a read operation, or between receipt of a R/W CLK signal at the latch 25 and receipt of a DATA CLK signal at the latch 150 during a write operation—must be precisely controlled in order to provide the optimum rate of data transfer to and from a memory array for a given clock rate. Selection of the data clock delay is critical for high-frequency applications, such as in the 300 MHz to 500 MHz range, in order to provide optimum data transfer rates and to insure reliable data transfer. For DDR memory applications, selection of the data clock delay becomes especially important, as data is latched into or out of a memory device on both the leading and trailing edge of a R/W CLK signal. Again, the data clock delay is generally a parameter set or determined by the memory controller.

Generally, selection of an appropriate data clock delay is based on known or expected operating characteristics—such as, for example, clock speed, signal path length, operating voltage, operating temperature, etc.—of a memory device. However, the selection of a proper data clock delay for a given application can be a difficult task for a number of reasons.

As noted above, a processor 10 and memory controller 20 may be configured to interact with one or more memory modules 30, each comprising multiple memory devices 100. It is possible that not all of the memory devices 100 making up a memory module 30 are of the same design (i.e., different manufacturers), in which case at least a portion of the memory devices 100 may operate at a speed different than the speed at which other memory devices 100 operate. Also, even if the memory devices 100 comprising a memory module 30 are of the same design and manufacturer, process variations during fabrication may result in memory chips capable of operating at vastly different speeds. Process variations, for example, may result in variation of signal path length and the speed at which a signal path can transmit an electrical signal. In either instance, the characteristics of each memory device 100 in the computer system 5 must be known in order to select an appropriate data clock delay for each DQ line 143, for each memory device 100, for each memory module 30, or for the system (i.e., all memory modules 30) as a whole. Further, operating conditions such as voltage, as well as environmental conditions such as temperature and humidity, can affect the speed at which a memory device 100 can transmit data.

One method of selecting a data clock delay and insuring reliable data transfer to and from a plurality of memory devices is to provide a "guaranteed setup and hold." A clock signal generally comprises a pulse, or a series of pulses, of a specified pulse shape (such as a square wave) having a leading edge and a trailing edge. If data is to be sampled on the leading edge of a clock pulse, "setup" time refers to a time window in front of the leading edge of a clock pulse in which a data signal must be stable, which insures that the correct data value appears or is available when, or prior to the time at which, the leading edge of the clock pulse arrives and sampling occurs. Hold time refers to a time window after the leading edge of the clock pulse in which the data signal must be stable, which insures that the data value is held or made available for sampling and that sampling occurs within this time window before another data bit arrives.

For guaranteed setup and hold, the setup and hold time window is selected such that a data bit is sampled during the data valid window. Thus, with reference to FIGS. 1 through 4, latching of a data bit from the memory array 110 to the output buffer 148 during a read operation occurs in response to receipt of a DATA CLK signal at the latch 150, as noted above. The data clock delay (i.e., the time delay between the DATA CLK and R/W CLK signals) must, therefore, be selected such that sampling of that data bit at the output buffer 148 will occur at some finite time after the time at which the DATA CLK signal is received at the latch 150 (i.e., the setup time, which insures a data bit is available for sampling) and also that sampling occurs within some finite time after receipt of the DATA CLK signal at the latch 150 (i.e., the hold time, which insures a data bit is sampled while that data bit is available), such that the data bit is sampled during its data valid window. Again, for DDR memory applications, data is written into or read out of a memory device on both the leading and trailing edge of a clock pulse; thus, a setup and hold time window must be provided around the trailing edge of the clock pulse as well.

Although utilizing a guaranteed setup and hold is generally a relatively simple method of providing reliable data transfer, the guaranteed setup and hold method is impractical for high-speed memory applications. Currently, memory devices are being designed to operate at clock rates in the range of 300 MHz to 500 MNHz. At these relatively high operating frequencies, utilizing a guaranteed setup and hold is impractical because it becomes increasingly difficult to insure that the time window for sampling provided by the selection of guaranteed setup and hold times will overlap with the data valid window for any given data bit or bits.

Figure 5:
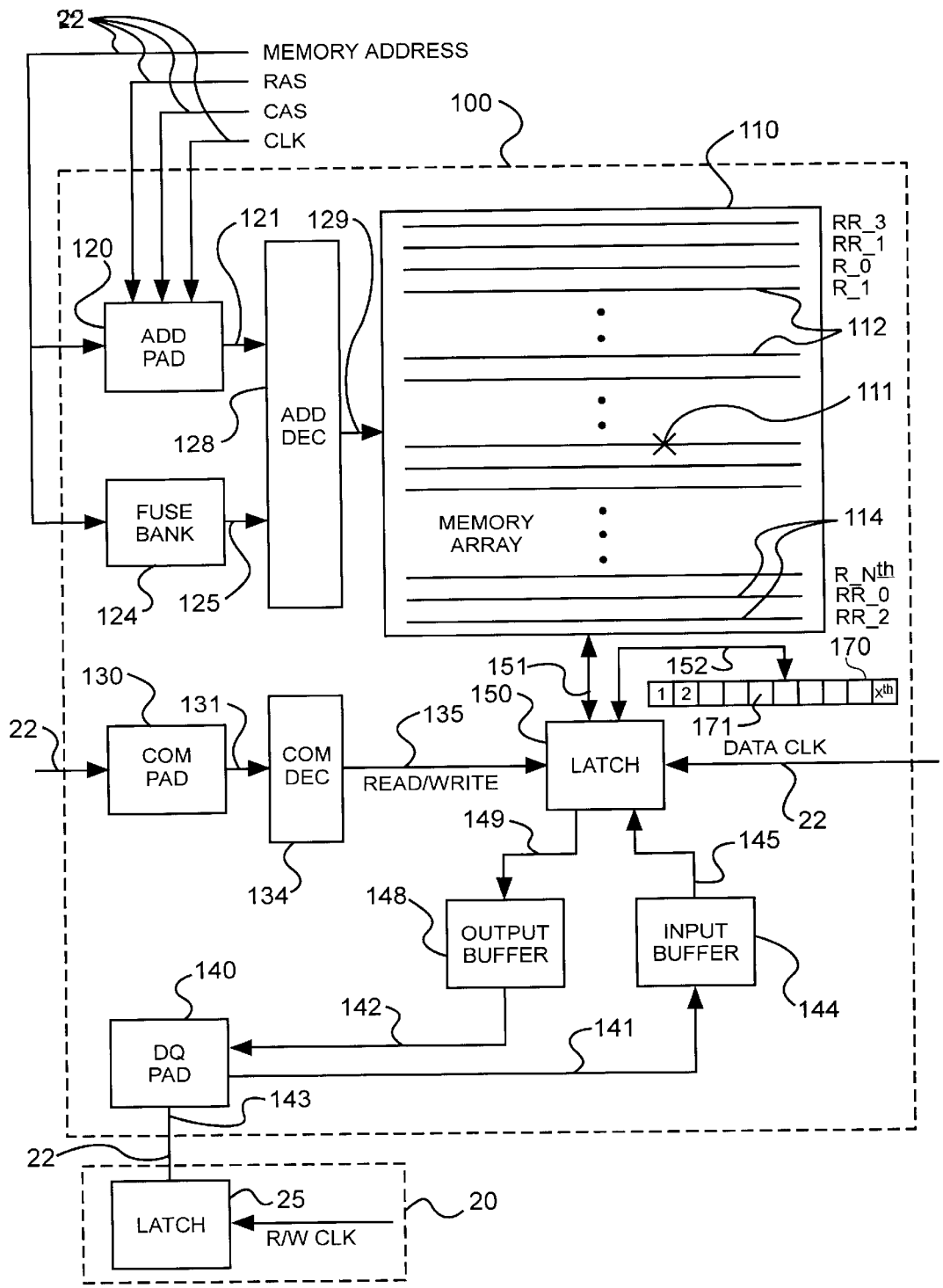
FIG. 5 is a schematic view of another embodiment of a conventional memory device including dedicated calibration registers.

As an alternative to utilizing a guaranteed setup and hold, it is known in the art to calibrate a memory device and to select the data clock delay based upon a calibration sequence—often referred to as "read/write timing calibration"—to provide optimum data transfer rates. One conventional method for performing read/write timing calibration, as shown in FIG. 5, is to construct a plurality of dedicated registers for each DQ line 143, such as, for example, an $X^{th}$ deep register 170 comprising a plurality of memory cells or registers 171. The $X^{th}$ deep register 170 is connected to the latch 150 by an electrical conductor or conductors 152. A unique data pattern can be written to and read from the plurality of registers 171 of the $X^{th}$ deep register 170 to perform a calibration sequence. The unique data pattern can be any unique combination of data bits (i.e., "0"s and "1"s), as desired.

To perform a read/write timing calibration sequence, a unique data pattern is written into the $X^{th}$ deep register 170 at a relatively slow rate to insure the unique data pattern is reliably written to the $X^{th}$ deep register 170. The stored unique data pattern is then read out of the $X^{th}$ deep register 170 at a fast rate and the memory controller 20 or processor 10 compares the retrieved unique data pattern with the known unique data pattern to determine if any errors occurred during the read procedure. If no errors are detected, the data clock delay is adjusted to read at a higher speed and the write/read procedure repeated. If an error is detected, the data clock delay is adjusted to read at a slower speed and the write/read procedure repeated. The steps of writing the unique data pattern to the $X^{th}$ deep register 170 at a relatively slow rate, reading out the unique data pattern from the $X^{th}$ deep register 170 at a fast rate, and adjusting the data clock delay are repeated until the optimum data clock delay is identified, such that data can be read from the memory device 100 at the fastest possible rate.

Also, read/write timing calibration may comprise writing a unique data pattern into an $X^{th}$ deep register 170 at a fast rate and then reading the unique data pattern out at a relatively slow rate to insure the stored unique data pattern is reliably read out. The retrieved unique data pattern is then compared against the known unique data pattern to determine if any errors occurred during the write procedure. If no errors are detected, the data clock delay is adjusted to write at a higher speed and the write/read procedure repeated. If an error is detected, the data clock delay is adjusted to write at a slower speed and the write/read procedure repeated. The steps of writing the unique data pattern to the $X^{th}$ deep register 170 at a fast rate, reading out the unique data pattern from the $X^{th}$ deep register 170 at a relatively slow rate, and adjusting the data clock delay are repeated until the optimum data clock delay is identified, such that data can be written into the memory device 100 at the fastest possible rate.

Generally, read/write timing calibration can be performed at the DQ level, the device level, the module level, or the system level. For DQ level calibration, read/write timing calibration is performed individually for all DQ lines 143 (see FIGS. 3 and 4) on all memory modules 30 within a computer system 5, and a data clock delay is selected and stored for each individual DQ line 143. Data transmission on a specified DQ line 143 is then conducted using the data clock delay for that specific DQ line 143. For device level calibration, a single data clock delay is selected to provide reliable data transfer on all DQ lines 143 of a given memory device 100, such that data transmission on any DQ line 143 of a memory device 100 is conducted using the data clock delay for that memory device 100. In module level calibration, a single data clock delay is selected to provide reliable data transfer on all DQ lines 143 of a given memory module 30, such that data transmission on any DQ line 143 of a memory module 30 is performed using the data clock delay for that memory module 30. Similarly, a single data clock delay may be selected to provide reliable data transfer on all DQ lines of a computer system 5—i.e., system level calibration—such that data transmission on any DQ line 143 is performed using the system data clock delay.

Generally, on a memory device 100, the signal path lengths from the DQ line 143 to the memory array 110 are approximately equal for all DQ lines 143, and the differences in data transfer rates between DQ lines 143 of a memory device 100 is mostly due to additional signal path length introduced at the module and system levels. Thus, at low clock rates, system or module level calibration may be sufficient. However, at high operating frequency, small differences in signal path length among the DQ lines 143 of a memory device 100 are magnified, and device level or DQ level calibration may be necessary. Also, for any of the above-described levels of read/write timing calibration, a single data clock delay may be selected that is optimized for both read and write procedures. Alternatively, a data clock delay may be selected for read operations and a separate data clock delay may be selected for write operations.

Performing read/write timing calibration is believed to be a suitable method of selecting optimum timing parameters for high-speed memory applications. However, known methods for performing read/write timing calibration come at a high "cost" from a design and performance standpoint. Specifically, the addition of an $X^{th}$ deep register 170, or some other calibration element, on each DQ line 143 of a memory device 100 consumes valuable "real estate" on the surface of the memory device 100. In order to maximize the capability and performance of a memory device 100, or proposed memory device design, it is desirable to eliminate redundant or unnecessary logic circuitry and memory components, such that the surface area or real estate available for the memory array 110 can be maximized. Furthermore, the unique data pattern used during read/write timing calibration would be limited in length by the number of registers 171 that are available in the $X^{th}$ deep register 170, and increasing the length of the data pattern for use in calibration—and, hence, the number of registers 171— consumes even more surface area of a memory device 100.

Read/write timing calibration of high-frequency memory devices may, however, be performed according to any one of a number of embodiments of the present invention without the above-described limitations of prior art calibration methods, as will now be described in detail.

Figure 6:
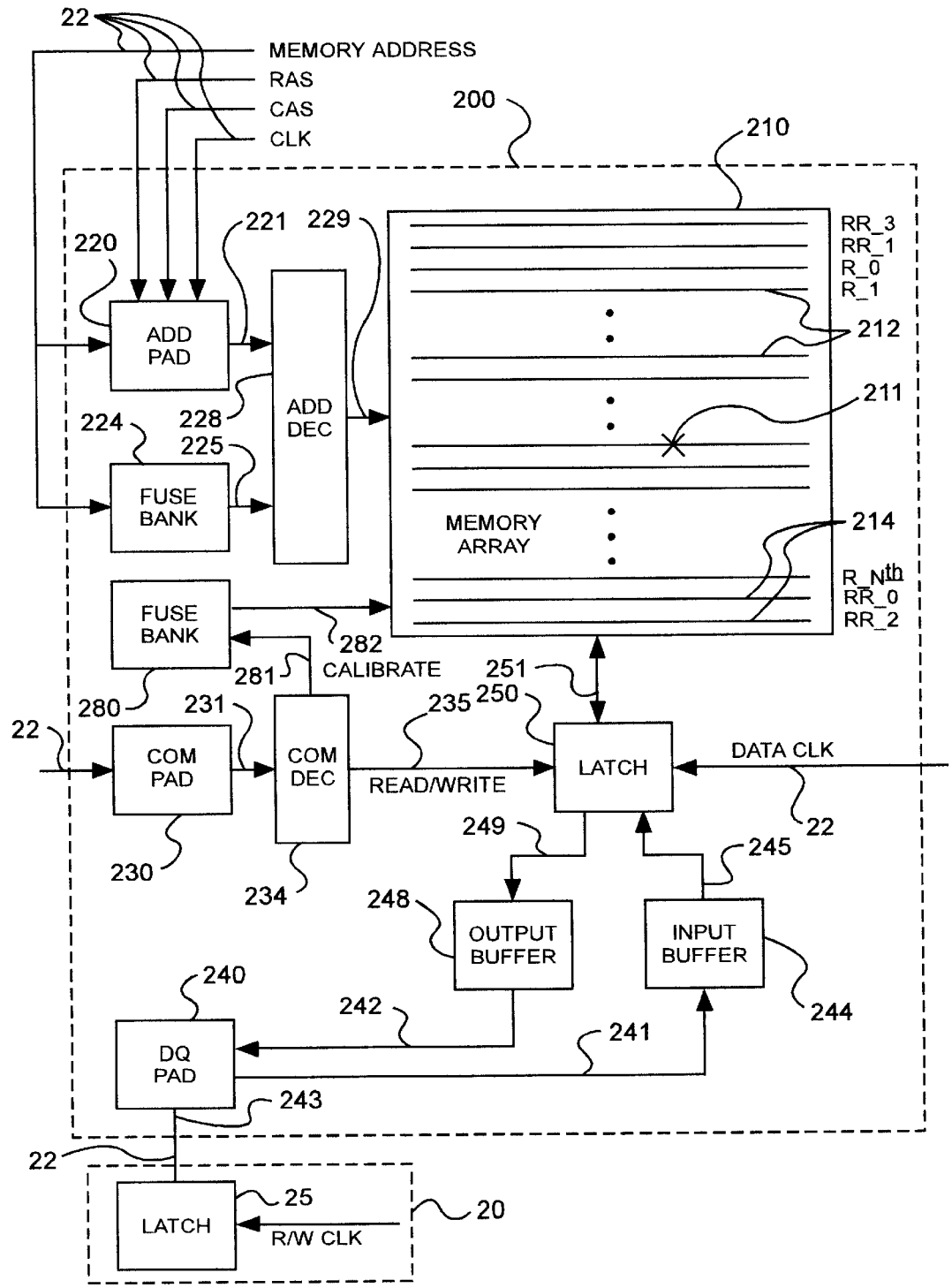
FIG. 6 is a schematic view of an embodiment of a memory device according to the present invention.
Figure 7:
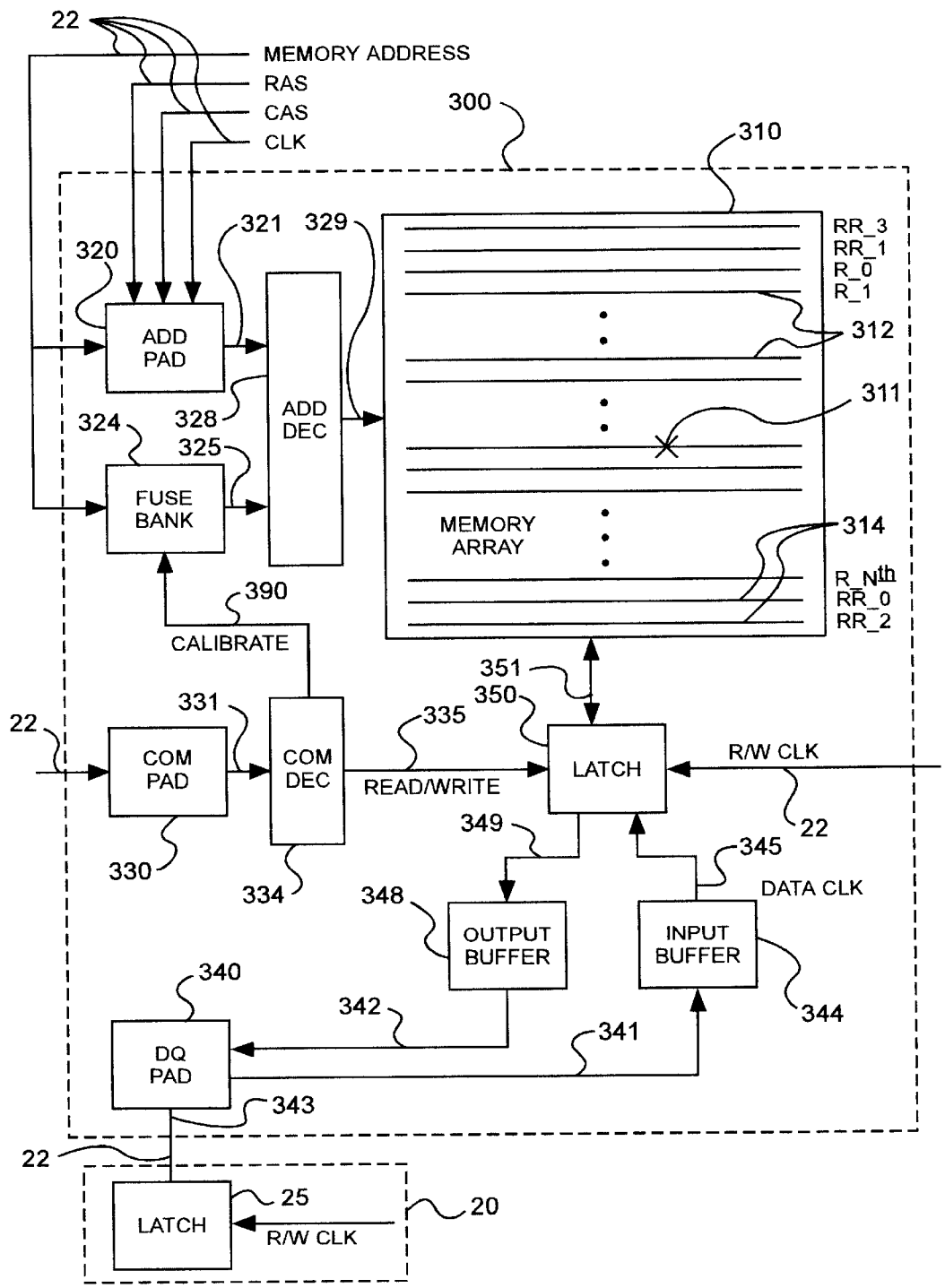
FIG. 7 is a schematic view of another embodiment of a memory device according to the present invention.
Figure 8:
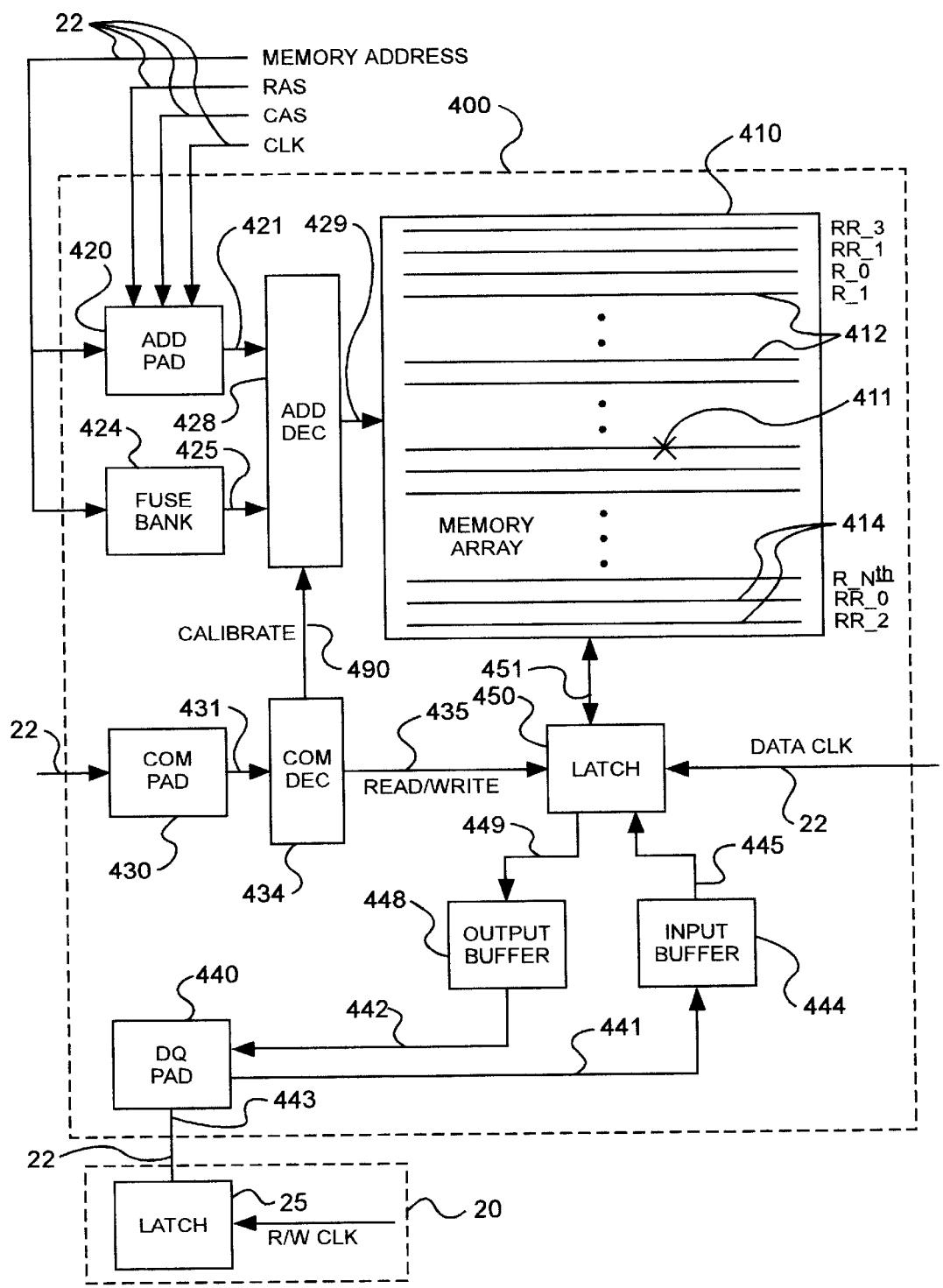
FIG. 8 is a schematic view of a further embodiment of a memory device according to the present invention.

Shown in FIG. 6 is a memory device 200 configured for read/write timing calibration according to one embodiment of the present invention. Shown in FIG. 7 is a memory device 300 configured for read/write timing calibration according to another embodiment of the present invention, and shown in FIG. 8 is a memory device 400 configured for read/write timing calibration according to a further embodiment of the present invention. The memory devices 200, 300, 400 shown in FIGS. 6, 7, and 8, respectively, may be used with any conventional memory architecture or computer system known in the art, such as the conventional computer system 5 shown and described with respect to FIGS. 1 through 4. Accordingly, the memory devices 200, 300, 400 are described with reference to the conventional computer system 5 of FIG. 1. Also, the memory devices 200, 300, 400 may comprise any suitable memory devices, such as, by way of example, synchronous DRAM devices. Further, the memory devices 200, 300, 400 may utilize synchronous link architecture or DDR technology.

Referring to FIG. 6, the memory device 200 includes a memory array 210 comprising a plurality of memory cells 211 arranged in rows 212 (i.e., R_0, R_1, ..., R_$N^{th}$) and columns (not shown). The memory array 210 also includes a plurality of redundant rows 214 (i.e., RR_0, RR_1, RR_2, RR_3) of memory cells 211 for repair of failing memory cells 211 in the memory array 210, as described above with respect to the conventional memory device 100 shown in FIG. 2. Although the memory device 200 is depicted as including a unitary memory array, those of ordinary skill in the art will understand that the memory device 200 may include a memory array comprising two or more subarrays, each subarray including a plurality of memory cells arranged in rows and columns, as well as a plurality of redundant rows of memory cells.

The memory device 200 includes an address pad 220 configured for receiving a CLK signal, RAS signals, CAS signals, and MEMORY ADDRESS data over memory bus 22 from the memory controller 20. An address decoder 228 is coupled to the address pad 220 by an electrical conductor or conductors 221, and the address decoder 228 is coupled to the memory array 210 by an electrical conductor or conductors 229. A fuse bank 224, or a plurality thereof, is coupled to the address decoder 228 via an electrical conductor or conductors 225 and is configured to receive the MEMORY ADDRESS data from the memory bus 22. The fuse bank 224 contains a plurality of programmable fuses or other suitable nonvolatile programmable elements. The fuse bank 224 is used for repair of failing memory cells 211 in the memory array 210, as shown and described with respect to the conventional memory device 100 shown in FIG. 2, and is configured to send a match signal to the address decoder 228 if a redundant row 214 is to be addressed.

The memory device 200 also includes a command pad 230 configured to receive command signals from a memory controller 20 over the memory bus 22. A command decoder 234 is coupled via an electrical conductor or conductors 231 to the command pad 230. The command decoder 234 decodes command signals received from the command pad 230 and provides the decoded signals via an electrical conductor or conductors 235 to a latch 250. The memory device 200 further includes a DQ pad 240 having a data input/output port, or DQ line, 243 for receiving data via memory bus 22 from the memory controller 20. The DQ pad 240 is coupled via an electrical conductor or conductors 241 to an input buffer 244, which, in turn, is coupled to the latch 250 by an electrical conductor or conductors 245. An output buffer 248 is coupled to the DQ pad 240 by an electrical conductor or conductors 242, and the output buffer 248 is also coupled via an electrical conductor or conductors 249 to the latch 250.

The latch 25 of memory controller 20 is configured to latch data into and out of the DQ pad 240 in response to a R/W CLK signal received from the memory controller 20. The latch 250, which is coupled to the memory array 210 by one or more electrical conductors 251, is configured to latch data into and out of the memory array 210 in response to a DATA CLK signal provided by the memory controller 20.

Those of ordinary skill in the art will understand that the memory device 200 may include other components or subsystems in addition to those shown in FIG. 6, which have been omitted for clarity and ease of understanding. For example, the memory device 200 may further include sense amplifiers and additional logic circuitry. Further, the memory device 200 may include two or more DQ lines 243 (see FIGS. 3 and 4).

To write a data bit to the memory array 210 of the memory device 200, the memory controller 20 sends the data bit over the DQ line 243 to the DQ pad 240 in response to the R/W CLK signal received at the latch 25. The DQ pad 240 transmits the data bit to the input buffer 244, where the data bit is held until latching into the memory array 210. The memory controller 20 also sends a corresponding MEMORY ADDRESS to the address pad 220 and a command signal (i.e., a WRITE command) to the command pad 230. Upon receipt of the appropriate RAS and CAS signals, the address decoder 228 decodes the row and column addresses and a specified memory cell 211 in the memory array 210 is activated. At a specified time delay—i.e., the data clock delay—after the data bit is clocked into the DQ pad 240 in response to the R/W CLK signal, the memory controller provides a DATA CLK signal to the latch 250. Upon receipt of the DATA CLK signal (and receipt of the WRITE command), the latch 250 samples the input buffer 244 and latches the data bit to the activated memory cell 211. The data clock delay must be selected such that sampling of the data bit stored at the input buffer 244 occurs within the data valid window for that data bit.

To read a data bit from a specified memory cell 211 of the memory array 210, the memory controller 20 sends a corresponding MEMORY ADDRESS to the address pad 220 and a command signal (i.e., a READ command) to the command pad 230. Upon receipt of the appropriate RAS and CAS signals, the address decoder 228 decodes the row and column addresses and the specified memory cell 211 is accessed and the data bit stored therein held for latching out of the memory array 210. The memory controller 20 then provides a DATA CLK signal to the latch 250 and, upon receipt of the DATA CLK signal (and receipt of the READ command), the latch 250 samples the specified memory cell 211 and latches the data bit stored therein out to the output buffer 248. The data bit is then transmitted to the DQ pad 240. At a specified time period after the data bit is latched to the output buffer 248 in response to the DATA CLK signal—i.e., the data clock delay—the memory controller provides a R/W CLK signal to the latch 25, and the data bit held at the DQ pad 240 is then sampled and read out through the DQ line 243 to the memory controller 20. The data clock delay must be selected such that sampling of the data bit stored at the DQ pad 240 occurs within the data valid window for that data bit.

To select the optimum data clock delay for the memory device 200, read/write timing calibration is performed in conjunction with a calibration fuse bank 280, or a plurality thereof, provided on the memory device 200. The calibration fuse bank 280 is coupled to the command decoder 234 by an electrical conductor or conductors 281 and is coupled via an electrical conductor or conductors 282 to the memory array 210. Although the fuse bank or banks 224 and the calibration fuse bank or banks 280 are shown as separate elements, those of ordinary skill in the art will understand that, in practice, the calibration fuse bank or banks 280 may be constructed integral with the fuse bank or banks 224. Accordingly, the addition of one or more calibration fuse banks 280 will consume little, if any, additional surface area of the memory device 200. Also, the calibration fuse bank or banks 280 may comprise programmable fuses or any other nonvolatile programmable elements known in the art.

To perform read/write timing calibration of the memory device 200, one or more calibration fuses of the calibration fuse bank 280 are blown (i.e., programmed) for one of the redundant rows 214 of the memory array 210 that is not being utilized by the memory array 210, or one or more calibration fuses of the calibration fuse bank 280 are blown for each of the redundant rows 214 not being used by the memory array 210. Thus, the calibration fuse bank 280 may store the addresses of all redundant rows 214 not being used by the memory array 210 for repair. During read/write timing calibration, a calibrate command is provided to the command pad 230, which provides the calibrate command to the command decoder 234. The command decoder 234 decodes the calibrate command and provides a CALIBRATE signal to the calibration fuse bank 280. Upon receipt of the CALIBRATE signal, the calibration fuse bank 280 will address any one of the redundant rows 214 not in use—or, optionally, a specific redundant row 214 not in use—and activate all of the memory cells 211 in that redundant row 214 for calibration.

A known, unique data pattern is then written into the activated redundant row 214 at a slow rate to insure reliable data transfer. The unique data pattern may be any suitable combination of "0" and "1" bits and, further, may have a length equal to the number of memory cells 211 in the activated redundant row 214. An initial data clock delay is selected by the memory controller 20 to provide a relatively fast read-out of data from the activated redundant row 214 and the unique data pattern is read out from the activated redundant row 214. The memory controller 20 (or processor 10) compares the unique data pattern as read out against the known unique data pattern.

If an error is detected in the unique data pattern, the data clock delay is adjusted to read out at a slower rate, or to insure that sampling of each data bit at the DQ pad 240 occurs within a data bit's data valid window. If no error is detected in the unique data pattern, the data clock delay is adjusted to increase the data transfer rate for a read operation. The process of writing a unique data pattern to an activated redundant row 214 at a relatively slow rate, reading the unique data pattern out at a fast rate, and adjusting the data clock delay is repeated until the optimum data clock delay is identified that enables data to be read out at the maximum possible rate for a particular DQ line 243.

Read/write timing calibration may also comprise writing a known, unique data pattern into the activated redundant row 214 at a fast rate—the data transfer rate during the write procedure being determined by the initial data clock delay selected by memory controller 20—and reading the unique data pattern out at a relatively slow rate to insure a reliable data transfer during the read operation. Again, the unique data pattern may be any suitable combination of "0" and "1" bits and, further, may have a length equal to the number of memory cells 211 in the activated redundant row 214. The memory controller 20 (or processor 10) compares the unique data pattern as read out against the known unique data pattern.

If an error is detected in the unique data pattern, the data clock delay is adjusted to write in at a slower rate, or to insure that sampling of each data bit at the input buffer 244 occurs within a data bit's data valid window. If no error is detected in the unique data pattern, the data clock delay is adjusted to increase the data transfer rate for a write operation. The process of writing a unique data pattern to an activated redundant row 214 at a fast rate, reading the unique data pattern out at a relatively slow rate, and adjusting the data clock delay is repeated until the optimum data clock delay is identified that enables data to be written at the maximum possible rate for a particular DQ line 243.

In an alternative embodiment, the calibration fuse bank 280 is programmed with one or more of the rows 212 of the memory array 210. Read/write timing calibration proceeds as described above; however, the unique data pattern is written to and read from a row 212 of the memory array 210, rather than a redundant row 214. In a further alternative embodiment, the row or rows 212 programmed in the calibration fuse bank 280 and used during read/write timing calibration are selected from a group of rows 212 not being utilized by the memory array 210 due to the nature of the specific application for which the memory device 200 is being used.

Referring to FIG. 7, the memory device 300 includes a memory array 310 comprising a plurality of memory cells 311 arranged in rows 312 (i.e., R_0, R_1, ..., R_N$^{th}$) and columns (not shown). The memory array 310 also includes a plurality of redundant rows 314 (i.e., RR_0, RR_1, RR_2, RR_3) of memory cells 311 for repair of failing memory cells 311 in the memory array 310, as described above with respect to the conventional memory device 100 shown in FIG. 2. Although the memory device 300 is depicted as including a unitary memory array, those of ordinary skill in the art will understand that the memory device 300 may include a memory array comprising two or more subarrays, each subarray including a plurality of memory cells arranged in rows and columns, as well as a plurality of redundant rows or redundant columns of memory cells.

The memory device 300 includes an address pad 320 configured for receiving a CLK signal, RAS signals, CAS signals, and MEMORY ADDRESS data over memory bus 22 from the memory controller 20. An address decoder 328 is coupled to the address pad 320 by an electrical conductor or conductors 321, and the address decoder 328 is coupled to the memory array 310 by an electrical conductor or conductors 329. A fuse bank 324, or a plurality thereof, is coupled to the address decoder 328 via an electrical conductor or conductors 325 and is configured to receive the MEMORY ADDRESS data from the memory bus 22. The fuse bank 324 contains a plurality of programmable fuses or other suitable nonvolatile programmable elements. The fuse bank 324 is used for repair of failing memory cells 311 in the memory array 310, as shown and described with respect to the conventional memory device 100 shown in FIG. 2, and is configured to send a match signal to the address decoder 328 if a redundant row 314 is to be addressed.

The memory device 300 also includes a command pad 330 configured to receive command signals from a memory controller 20 over the memory bus 22. A command decoder 334 is coupled via an electrical conductor or conductors 33 1 to the command pad 330. The command decoder 334 decodes command signals received from the command pad 330 and provides the decoded signals via an electrical conductor or conductors 335 to a latch 350. The memory device 300 further includes a DQ pad 340 having a data input/output port, or DQ line, 343 for receiving data via memory bus 22 from the memory controller 20. The DQ pad 340 is coupled via electrical conductor or conductors 341 to an input buffer 344, which, in turn, is coupled to the latch 350 by an electrical conductor or conductors 345. An output buffer 348 is coupled to the DQ pad 340 by an electrical conductor or conductors 342, and the output buffer 348 is also coupled via an electrical conductor or conductors 349 to the latch 350.

The latch 25 of memory controller 20 is configured to latch data into and out of the DQ pad 340 in response to a R/W CLK signal received from the memory controller 20. The latch 350, which is coupled to the memory array 310 by one or more electrical conductors 351, is configured to latch data into and out of the memory array 310 in response to a DATA CLK signal provided by the memory controller 20.

Those of ordinary skill in the art will understand that the memory device 300 may include other components or subsystems in addition to those shown in FIG. 7, which have been omitted for clarity and ease of understanding. For example, the memory device 300 may further include sense amplifiers and additional logic circuitry. Further, the memory device 300 may include two or more DQ lines 343 (see FIGS. 3 and 4).

To write a data bit to the memory array 310 of the memory device 300, the memory controller 20 sends the data bit over the DQ line 343 to the DQ pad 340 in response to the R/W CLK signal received at the latch 25. The DQ pad 340 transmits the data bit to the input buffer 344, where the data bit is held until latching into the memory array 310. The memory controller also sends a corresponding MEMORY ADDRESS to the address pad 320 and a command signal (i.e., a WRITE command) to the command pad 330. Upon receipt of the appropriate RAS and CAS signals, the address decoder 328 decodes the row and column addresses and a specified memory cell 311 in the memory array 310 is activated. At a specified time delay—i.e., the data clock delay—after the data bit is clocked into the DQ pad 340 in response to the R/W CLK signal, the memory controller provides a DATA CLK signal to the latch 350. Upon receipt of the DATA CLK signal (and receipt of the WRITE command), the latch 350 samples the input buffer 344 and latches the data bit to the activated memory cell 311. The data clock delay must be selected such that sampling of the data bit stored at the input buffer 344 occurs within the data valid window for that data bit.

To read a data bit from a specified memory cell 311 of the memory array 310, the memory controller 20 sends a corresponding MEMORY ADDRESS to the address pad 320 and a command signal (i.e., a READ command) to the command pad 330. Upon receipt of the appropriate RAS and CAS signals, the address decoder 328 decodes the row and column addresses and the specified memory cell 311 is accessed and the data bit stored therein held for latching out of the memory array 310. The memory controller 20 then provides a DATA CLK signal to the latch 350 and, upon receipt of the DATA CLK signal (and receipt of the READ command), the latch 350 samples the specified memory cell 311 and latches the data bit stored therein out to the output buffer 348. The data bit is then transmitted to the DQ pad 340. At a specified time period after the data bit is latched to the output buffer 348 in response to the DATA CLK signal—i.e., the data clock delay—the memory controller provides a R/W CLK signal to the latch 25, and the data bit held at the DQ pad 340 is then sampled and read out through the DQ line 343 to the memory controller 20. The data clock delay must be selected such that sampling of the data bit stored at the DQ pad 340 occurs within the data valid window for that data bit.

To select the optimum data clock delay for the memory device 300, read/write timing calibration is performed in conjunction with the fuse bank (or banks) 324. The fuse bank 324 is coupled to the command decoder 334 by an additional electrical conductor or conductors 390. The addition of one or more electrical conductors 390 should consume negligible surface area of the memory device 300.

To perform read/write timing calibration of the memory device 300, a calibrate command is provided to the command pad 330, which provides the calibrate command to the command decoder 334. The command decoder 334 decodes the calibrate command and provides a CALIBRATE signal to the fuse bank 324. Upon receipt of the CALIBRATE signal, the fuse bank 324 will look for any redundant row 314 not being utilized by the memory array 310, as can be identified by one or more nonblown (nonprogrammed) fuses. The fuse bank 324 will then provide a row address to the address decoder 328 corresponding to any one of the redundant rows 314 not in use—or, optionally, a specific redundant row 314 not in use—and the address decoder 328 will activate all of the memory cells 311 in that redundant row 314 for calibration.

A unique data pattern is then written into the activated redundant row 314 at a slow rate to insure reliable data transfer. The unique data pattern may be any suitable combination of "0" and "1" bits and, further, may have a length equal to the number of memory cells 311 in the activated redundant row 314. An initial data clock delay is selected by the memory controller 20 to provide a relatively fast read-out of data from the activated redundant row 314 and the unique data pattern is read out from the activated redundant row 314. The memory controller 20 (or processor 10) compares the unique data pattern as read out against the known unique data pattern.

If an error is detected in the unique data pattern, the data clock delay is adjusted to read out at a slower rate, or to insure that sampling of each data bit at the DQ pad 340 occurs within a data bit's data valid window. If no error is detected in the unique data pattern, the data clock delay is adjusted to increase the data transfer rate for a read operation. The process of writing a unique data pattern to an activated redundant row 314 at a relatively slow rate, reading the unique data pattern out at a fast rate, and adjusting the data clock delay is repeated until the optimum data clock delay is identified that enables data to be read out at the maximum possible rate for a particular DQ line 343.

Read/write timing calibration may also comprise writing a known, unique data pattern into the activated redundant row 314 at a fast rate—the data transfer rate during the write procedure being determined by the initial data clock delay selected by memory controller 20—and reading the unique data pattern out at a relatively slow rate to insure a reliable data transfer during the read operation. Again, the unique data pattern may be any suitable combination of "0" and "1" bits and, further, may have a length equal to the number of memory cells 311 in the activated redundant row 314. The memory controller 20 (or processor 10) compares the unique data pattern as read out against the known unique data pattern.

If an error is detected in the unique data pattern, the data clock delay is adjusted to write in at a slower rate, or to insure that sampling of each data bit at the input buffer 344 occurs within a data bit's data valid window. If no error is detected in the unique data pattern, the data clock delay is adjusted to increase the data transfer rate for a write operation. The process of writing a unique data pattern to an activated redundant row 314 at a fast rate, reading the unique data pattern out at a relatively slow rate, and adjusting the data clock delay is repeated until the optimum data clock delay is identified that enables data to be written at the maximum possible rate for a particular DQ line 343.

Referring to FIG. 8, the memory device 400 includes a memory array 410 comprising a plurality of memory cells 411 arranged in rows 212 (i.e., $R\_0, R\_1, \ldots, R\_N^{th}$) and columns (not shown). The memory array 410 also includes a plurality of redundant rows 414 (i.e., RR_0, RR_1, RR_2, RR_3) of memory cells 411 for repair of failing memory cells 411 in the memory array 410, as described above with respect to the conventional memory device 100 shown in FIG. 2. Although the memory device 400 is depicted as including a unitary memory array, those of ordinary skill in the art will understand that the memory device 400 may include a memory array comprising two or more subarrays, each subarray including a plurality of memory cells arranged in rows and columns, as well as a plurality of redundant rows or redundant columns of memory cells.

The memory device 400 includes an address pad 420 configured for receiving a CLK signal, RAS signals, CAS signals, and MEMORY ADDRESS data over memory bus 22 from the memory controller 20. An address decoder 428 is coupled to the address pad 420 by an electrical conductor or conductors 421, and the address decoder 428 is coupled to the memory array 410 by an electrical conductor or conductors 429. A fuse bank 424, or a plurality thereof, is coupled to the address decoder 428 via an electrical conductor or conductors 425 and is configured to receive the MEMORY ADDRESS data from the memory bus 22. The fuse bank 424 contains a plurality of programmable fuses or other suitable nonvolatile programmable elements. The fuse bank 424 is used for repair of failing memory cells 411 in the memory array 410, as shown and described with respect to the conventional memory device 100 shown in FIG. 2, and is configured to send a match signal to the address decoder 428 if a redundant row 414 is to be addressed.

The memory device 400 also includes a command pad 430 configured to receive command signals from a memory controller 20 over the memory bus 22. A command decoder 434 is coupled via an electrical conductor or conductors 431 to the command pad 430. The command decoder 434 decodes command signals received from the command pad 430 and provides the decoded signals via an electrical conductor or conductors 435 to a latch 450. The memory device 400 further includes a DQ pad 440 having a data input/output port, or DQ line, 443 for receiving data via memory bus 22 from the memory controller 20. The DQ pad 440 is coupled via an electrical conductor or conductors 441 to an input buffer 444, which, in turn, is coupled to the latch 450 by an electrical conductor or conductors 445. An output buffer 448 is coupled to the DQ pad 440 by an electrical conductor or conductors 442, and the output buffer 448 is also coupled via an electrical conductor or conductors 449 to the latch 450.

The latch 25 of memory controller 20 is configured to latch data into and out of the DQ pad 440 in response to a R/W CLK signal received from the memory controller 20. The latch 450, which is coupled to the memory array 410 by one or more electrical conductors 451, is configured to latch data into and out of the memory array 410 in response to a DATA CLK signal provided by the memory controller 20.

Those of ordinary skill in the art will understand that the memory device 400 may include other components or subsystems in addition to those shown in FIG. 8, which have been omitted for clarity and ease of understanding. For example, the memory device 400 may further include sense amplifiers and additional logic circuitry. Further, the memory device 400 may include two or more DQ lines 443 (see FIGS. 3 and 4).

To write a data bit to the memory array 410 of the memory device 400, the memory controller 20 sends the data bit over the DQ line 443 to the DQ pad 440 in response to the R/W CLK signal received at the latch 25. The DQ pad 440 transmits the data bit to the input buffer 444, where the data bit is held until latching into the memory array 410. The memory controller also sends a corresponding MEMORY ADDRESS to the address pad 420 and a command signal (i.e., a WRITE command) to the command pad 430. Upon receipt of the appropriate RAS and CAS signals, the address decoder 428 decodes the row and column addresses and a specified memory cell 411 in the memory array 410 is activated. At a specified time delay—i.e., the data clock delay—after the data bit is clocked into the DQ pad 440 in response to the R/W CLK signal, the memory controller provides a DATA CLK signal to the latch 450. Upon receipt of the DATA CLK signal (and receipt of the WRITE command), the latch 450 samples the input buffer 444 and latches the data bit to the activated memory cell 411. The data clock delay must be selected such that sampling of the data bit stored at the input buffer 444 occurs within the data valid window for that data bit.

To read a data bit from a specified memory cell 411 of the memory array 410, the memory controller 20 sends a corresponding MEMORY ADDRESS to the address pad 420 and a command signal (i.e., a READ command) to the command pad 430. Upon receipt of the appropriate RAS and CAS signals, the address decoder 428 decodes the row and column addresses and the specified memory cell 411 is accessed and the data bit stored therein held for latching out of the memory array 410. The memory controller 20 then provides a DATA CLK signal to the latch 450 and, upon receipt of the DATA CLK signal (and receipt of the READ command), the latch 450 samples the specified memory cell 411 and latches the data bit stored therein out to the output buffer 448. The data bit is then transmitted to the DQ pad 440. At a specified time period after the data bit is latched to the output buffer 448 in response to the DATA CLK signal—i.e., the data clock delay—the memory controller provides a R/W CLK signal to the latch 25, and the data bit held at the DQ pad 440 is then sampled and read out through the DQ line 443 to the memory controller 20. The data clock delay must be selected such that sampling of the data bit stored at the DQ pad 440 occurs within the data valid window for that data bit.

To select the optimum data clock delay for the memory device 400, the command decoder 434 is directly coupled to the address decoder 428 by an additional electrical conductor or conductors 490, and the memory controller 20 (or processor 10) is programmed with the row addresses of the row or rows 412 that are to be used for read/write timing calibration. A row used for calibration may be a row 412 of the memory array 410 or, alternatively, a row 412 of the memory array 410 selected from a group of rows 412 not being utilized by the memory array 410 due to the nature of the specific application for which the memory device 400 is being used. The addition of one or more electrical conductors 490 should consume negligible surface area of the memory device 400.

During read/write timing calibration of the memory device 400, a calibrate command is provided to the command pad 430, which provides the calibrate command to the command decoder 434. The command decoder 434 decodes the calibrate command and provides a CALIBRATE signal to the address decoder 428 directing the address decoder 428 to select a row 412—or, optionally, a row 412 not being used by the memory array 410 for, or during, a specific application—for calibration. Upon receipt of the CALIBRATE signal, the address decoder 428 will select a row 412 and activate all of the memory cells 411 in that row 412 for calibration.

A unique data pattern is then written into the activated row 412 at a slow rate to insure reliable data transfer. The unique data pattern may be any suitable combination of "0" and "1" bits and, further, may have a length equal to the number of memory cells 411 in the activated row 412. An initial data clock delay is selected by the memory controller 20 to provide a relatively fast read-out of data from the activated row 412 and the unique data pattern is read out from the activated row 412. The memory controller 20 (or processor 10) compares the unique data pattern as read out against the known unique data pattern.

If an error is detected in the unique data pattern, the data clock delay is adjusted to read out at a slower rate, or to insure that sampling of each data bit at the DQ pad 440 occurs within a data bit's data valid window. If no error is detected in the unique data pattern, the data clock delay is adjusted to increase the data transfer rate for a read operation. The process of writing a unique data pattern to an activated row 412 at a relatively slow rate, reading the unique data pattern out at a fast rate, and adjusting the data clock delay is repeated until the optimum data clock delay is identified that enables data to be read out at the maximum possible rate for a particular DQ line 443.

Read/write timing calibration may also comprise writing a known, unique data pattern into the activated row 412 at a fast rate—the data transfer rate during the write procedure being determined by the initial data clock delay selected by memory controller 20—and reading the unique data pattern out at a relatively slow rate to insure a reliable data transfer during the read operation. Again, the unique data pattern may be any suitable combination of "0" and "1" bits and, further, may have a length equal to the number of memory cells 411 in the activated row 412. The memory controller 20 (or processor 10) compares the unique data pattern as read out against the known unique data pattern.

If an error is detected in the unique data pattern, the data clock delay is adjusted to write in at a slower rate, or to insure that sampling of each data bit at the input buffer 444 occurs within a data bit's data valid window. If no error is detected in the unique data pattern, the data clock delay is adjusted to increase the data transfer rate for a write operation. The process of writing a unique data pattern to an activated row 412 at a fast rate, reading the unique data pattern out at a relatively slow rate, and adjusting the data clock delay is repeated until the optimum data clock delay is identified that enables data to be written at the maximum possible rate for a particular DQ line 443.

For read/write timing calibration using any of the embodiments of a memory device 200, 300, 400 disclosed herein, refreshing of the row being used for calibration is generally not necessary because this row is always activated during the read/write timing calibration sequence. However, if read/write timing calibration is being performed during operation of a memory device, it may be necessary to conduct the read/write timing calibration sequence during the time interval between refresh of the memory array, as it may not be possible to refresh the memory array while a read/write timing calibration sequence is in progress (i.e., generally only one row at a time of a memory array is activated).

As noted above, the memory array in a memory device, such as the memory devices 200, 300, 400, may comprise two or more subarrays. Read/write timing calibration according to the present invention may be performed using any row or redundant row in any one of the subarrays of a memory array. It is not, however, generally necessary to perform read/write timing calibration of each individual subarray of a plurality of subarrays comprising a memory array, although it is within the scope of the present invention to conduct individual subarray calibration.

Also, read/write timing calibration according to the present invention may be performed at any level. For example, a computer system including one or more memory modules, each incorporating a plurality of memory devices, such as the memory devices 200, 300, 400 disclosed herein, may be subjected to a read/write timing calibration sequence according to the present invention at the DQ level, at the device level, at the module level, and/or at the system level, as described above with respect to FIGS. 1 through 4.

Further, although read/write timing calibration according to the present invention would generally be performed using a row or a redundant row of a memory array, as conventional memory devices typically employ a page access mode, it is within the scope of the present invention to conduct read/write timing calibration using a column of memory cells of a memory array. For example, if a memory array includes a plurality of redundant columns for repair, rather than redundant rows, read/write timing calibration may be performed according to the present invention using any redundant column not being utilized by the memory array.

Those of ordinary skill in the art will appreciate the many advantages of performing read/write timing calibration using a row or a redundant row according to the present invention. Because an existing row or redundant row of a memory array is being used for calibration (although a fuse bank 224 may include a bank of calibration fuses 280), "real estate costs" are negligible or nonexistent for the read/write timing calibration methods of the present invention. Further, although a row or redundant row of the memory array is being used for calibration, the row address of the row or redundant row being used for calibration is identified by a calibration fuse bank 280, a nonblown fuse or fuses of a fuse bank 324, or a row address stored in a memory controller 20 and relayed to an address decoder 428 in a CALIBRATE signal. Thus, address decoding is essentially by-passed when conducting read/write timing calibration according to the present invention (although an address decoder 328, 428 may relay the row address of the row or redundant row being used for calibration to the memory array 310, 410).

Another advantage of the present invention is increased reliability of the read/write timing calibration procedure due to the length of the unique data pattern that can be used during calibration. Generally, the likelihood that a data transfer error will be detected during a calibration sequence increases as the number of data bits comprising the unique data pattern increases. For prior art calibration methods, the length of the unique data pattern was limited by the number of dedicated calibration registers constructed on each DQ line of a memory device (see FIG. 5). Providing a large number of dedicated registers for calibration—and, hence, increased reliability of calibration—consumes additional surface area of a memory device; therefore, there is a tradeoff between calibration reliability and "real estate costs." However, for read/write timing calibration according to the present invention, the length of the unique data pattern is only limited by the number of memory cells in the row or redundant row being used for calibration and, as noted above, the "real estate costs" are minimal for the present invention.

Yet another advantage of the read/write timing calibration methods according to the present invention is the ability to conduct read/write timing calibration during operation of a memory device, memory module, and/or computer system. As noted above, a row of a memory array may not be utilized by the memory array during a specific application and a redundant row of a memory array may not be used by the memory array for repair. If such a row or redundant row not being utilized by a memory array is used to perform read/write timing calibration, a calibration sequence can be conducted without compromising integrity of the data stored in the memory array because the row or redundant row being used for calibration is not being utilized by the memory array. The ability to perform read/write timing calibration during operation of a memory device can be especially useful for applications involving large temperature swings or other adverse environmental conditions. As noted above, changes in voltage, temperature, humidity, as well as other environmental or operating characteristics, can alter the speed at which a memory device can transmit or exchange data.

In addition, the read/write timing calibration methods of the present invention are applicable to any type of synchronous memory devices, irrespective of the particular clock architecture employed by a memory device. Further, the calibration methods of the present invention may be used to perform read/write timing calibration for any type of computer system known in the art, such as the conventional computer system 5 shown and described with respect to FIGS. 1 through 4, regardless of the particular memory architecture utilized by the computer system. Accordingly, it should be understood by those of ordinary skill in the art that the memory devices 200, 300, 400 shown and described with respect to FIGS. 6 through 8 are only exemplary, and read/write timing calibration using a row or redundant row according to the present invention may be performed using other methods on any type of memory device or computer system.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the disclosed embodiments, as well as alternative arrangements, may be devised by those skilled in the art without departing from the spirt of the present invention and the scope of the appended claims.

What is claimed is:

1. A method of calibrating a memory device, the memory device including a memory array comprising a plurality of memory cells arranged in rows and columns and further comprising a plurality of redundant rows of memory cells, the method comprising calibrating the memory device using one redundant row of the plurality of redundant rows of the memory array.

2. The method of claim 1, wherein the one redundant row is not used by the memory array.

3. The method of claim 2, further comprising calibrating the memory device while the memory device is operating.

4. A method of calibrating a memory module, the memory module including a plurality of memory devices, each memory device of the plurality of memory devices including a memory array comprising a plurality of memory cells arranged in rows and columns and further comprising a plurality of redundant rows of memory cells, the method comprising calibrating at least one memory device of the plurality of memory devices using one redundant row of the plurality of redundant rows of the memory array of the at least one memory device.

5. The method of claim 4, wherein the one redundant row is not used by the memory array of the at least one memory device.

6. The method of claim 5, further comprising calibrating the at least one memory device while the memory module is operating.

7. A method of calibrating a computer system, the computer system including a memory controller and a plurality of memory devices in electrical communication with the memory controller, each memory device of the plurality of memory devices including a memory array comprising a plurality of memory cells arranged in rows and columns and further comprising a plurality of redundant rows of memory cells, the method comprising calibrating at least one memory device of the plurality of memory devices using one redundant row of the plurality of redundant rows of the memory array of the at least one memory device.

8. The method of claim 7, wherein the one redundant row is not used by the memory array of the at least one memory device.

9. The method of claim 8, further comprising calibrating the at least one memory device while the computer system is operating.

10. A method of calibrating a memory device, the memory device including a memory array comprising a plurality of memory cells arranged in rows and columns and further comprising a plurality of redundant rows of memory cells, the method comprising calibrating the memory device using one row of the rows of the memory array, wherein the one row is not used by the memory array during operation of the memory device.

11. The method of claim 10, further comprising calibrating the memory device while the memory device is operating.

12. A method of calibrating a memory module, the memory module including a plurality of memory devices, each memory device of the plurality of memory devices including a memory array comprising a plurality of memory cells arranged in rows and columns and further comprising a plurality of redundant rows of memory cells, the method comprising calibrating at least one memory device of the plurality of memory devices using one row of the rows of the memory array of the at least one memory device, wherein the one row is not used by the memory array during operation of the at least one memory device.

13. The method of claim 12, further comprising calibrating the at least one memory device while the memory module is operating.

14. A method of calibrating a computer system, the computer system including a memory controller and a plurality of memory devices in electrical communication with the memory controller, each memory device of the plurality of memory devices including a memory array comprising a plurality of memory cells arranged in rows and columns and further comprising a plurality of redundant rows of memory cells, the method comprising calibrating at least one memory device of the plurality of memory devices using one row of the rows of the memory array of the at least one memory device wherein the one row is not used by the memory array during operation of the at least one memory device.

15. The method of claim 14, further comprising calibrating the at least one memory device while the computer system is operating.

16. A method of calibrating a memory device, the memory device including a memory array comprising a plurality of memory cells arranged in rows and columns and further comprising a plurality of redundant rows of memory cells, the method comprising:
    activating one redundant row of the plurality of redundant rows of the memory array; and calibrating the memory device using the one redundant row.

17. The method of claim 16, wherein the calibrating the memory device using the one redundant row comprises:
    writing a known data pattern to the one redundant row at a slow speed sufficient to insure reliable data transfer;
    reading a data pattern stored in the one redundant row from the one redundant row at a relatively fast speed;
    comparing the data pattern read from the one redundant row to the known data pattern written to the one redundant row to determine if an error occurred; and
    adjusting a data clock delay value based upon the comparison.

18. The method of claim 17, further comprising:
    selecting one DQ line of a plurality of DQ lines of the memory device for calibration; and
    writing the known data pattern to the one redundant row and reading the data pattern stored in the one redundant row over the one DQ line.

19. The method of claim 16, wherein the calibrating the memory device using the one redundant row comprises:
    writing a known data pattern to the one redundant row at a fast speed;
    reading a data pattern stored in the one redundant row from the one redundant row at a relatively slow speed sufficient to insure reliable data transfer;
    comparing the data pattern read from the one redundant row to the known data pattern written to the one redundant row to determine if an error occurred; and
    adjusting a data clock delay value based upon the comparison.

20. The method of claim 19, further comprising:
    selecting one DQ line of a plurality of DQ lines of the memory device for calibration; and
    writing the known data pattern to the one redundant row and reading the data pattern stored in the one redundant row over the one DQ line.

21. The method of claim 16, wherein the one redundant row is not used by the memory array.

22. The method of claim 19, further comprising calibrating the memory device while the memory device is operating.

23. A method of calibrating a memory device, the memory device including a memory array comprising a plurality of memory cells arranged in rows and columns and further comprising a plurality of redundant rows of memory cells, the method comprising:
    activating one row of the rows of the memory array; and
    calibrating the memory device using the one row including;
    writing a known data pattern to the one row at a slow speed sufficient to insure reliable data transfer;
    reading a data pattern stored in the one row from the one row at a relatively fast speed;
    comparing the data pattern read from the one row to the known data pattern written to the one row to determine if an error occurred; and
    adjusting a data clock delay value based upon the comparison.

24. The method of claim 23, further comprising:
selecting one DQ line of a plurality of DQ lines of the memory device for calibration; and
writing the known data pattern to the one row and reading the data pattern stored in the one row over the one DQ line.

25. A method of calibrating a memory device, the memory device including a memory array comprising a plurality of memory cells arranged in rows and columns and further comprising a plurality of redundant rows of memory cells, the method comprising:
activating one row of the rows of the memory array; and
calibrating the memory device using the one row comprising;
writing a known data pattern to the one row at a fast speed;
reading a data pattern stored in the one row from the one row at a relatively slow speed sufficient to insure reliable data transfer;
comparing the data pattern read from the one row to the known data pattern written to the one row to determine if an error occurred; and
adjusting a data clock delay value based upon the comparison.

26. The method of claim 25, further comprising:
selecting one DQ line of a plurality of DQ lines of the memory device for calibration; and
writing the known data pattern to the one row and reading the data pattern stored in the one row over the one DQ line.

27. A method of calibrating a memory device, the memory device including a memory array comprising a plurality of memory cells arranged in rows and columns and further comprising a plurality of redundant rows of memory cells, the method comprising:
activating one row of the rows of the memory array; and
calibrating the memory device using the one row wherein the one row is not used by the memory array during operation of the memory device.

28. The method of claim 27, further comprising calibrating the memory device while the memory device is operating.

29. A method of calibrating a memory device, the memory device including a memory array comprising a plurality of memory cells arranged in rows and columns and further comprising a plurality of redundant rows of memory cells, the method comprising:
providing at least one calibration fuse bank on the memory device;
programming the at least one calibration fuse bank with at least one row address corresponding to one redundant row of the plurality of redundant rows;
activating the one redundant row of the memory array; and
calibrating the memory device using the one redundant row.

30. The method of claim 29, wherein the one redundant row is not used by the memory array.

31. The method of claim 30, further comprising calibrating the memory device while the memory device is operating.

32. A method of calibrating a memory device, the memory device including a memory array comprising a plurality of memory cells arranged in rows and columns and further comprising a plurality of redundant rows of memory cells, the method comprising:
providing at least one calibration fuse bank on the memory device;
programming the at least one calibration fuse bank with at least one row address corresponding to one row of the rows of the memory array;
activating the one row of the memory array; and
calibrating the memory device using the one row.

33. The method of claim 32, wherein the one row is not used by the memory array during operation of the memory device.

34. The method of claim 33, further comprising calibrating the memory device while the memory device is operating.

35. A method of calibrating a memory device, the memory device including a fuse bank and a memory array, the memory array comprising a plurality of memory cells arranged in rows and columns and further comprising a plurality of redundant rows of memory cells, the method comprising:
looking for at least one nonblown fuse in the fuse bank to identify one redundant row of the plurality of redundant rows not being used by the memory array;
activating the one redundant row not being used by the memory array; and
calibrating the memory device using the one redundant row not being used by the memory array.

36. A method of calibrating a memory device, the memory device including a memory array comprising a plurality of memory cells arranged in rows and columns and further comprising a plurality of redundant rows of memory cells, the method comprising:
programming a memory controller with at least one row address corresponding to one row of the plurality of rows of the memory array;
providing the at least one row address to the memory array;
activating the one row of the memory array; and
calibrating the memory device using the one row of the memory array.

37. The method of claim 36, wherein the one row is not used by the memory array during operation of the memory device.

38. The method of claim 37, further comprising calibrating the memory device while the memory device is operating.

39. A memory device, comprising:
a memory array including a plurality of memory cells arranged in rows and columns and further including a plurality of redundant rows of memory cells;
a calibration fuse bank configured to be programmed with at least one row address corresponding to one redundant row of the plurality of redundant rows, the one redundant row not being used by the memory array.

40. A memory module, comprising:
a plurality of memory devices, each memory device of the plurality of memory devices having a memory array, the memory array including a plurality of memory cells arranged in rows and columns and further including a plurality of redundant rows of memory cells;
at least one memory device of the plurality of memory devices including a calibration fuse bank, the calibration fuse bank configured to be programmed with at least one row address corresponding to one redundant row of the plurality of redundant rows, the one redundant row not being used by the memory array of the at least one memory device.

41. A computer system, comprising:

a memory controller;

a plurality of memory devices in electrical communication with the memory controller, each memory device of the plurality of memory devices having a memory array, the memory array including a plurality of memory cells arranged in rows and columns and further including a plurality of redundant rows of memory cells;

at least one memory device of the plurality of memory devices including a calibration fuse bank, the calibration fuse bank configured to be programmed with at least one row address corresponding to one redundant row of the plurality of redundant rows, the one redundant row not being used by the memory array of the at least one memory device of the computer system.

42. A memory device, comprising:

a memory array including a plurality of memory cells arranged in rows and columns and further including a plurality of redundant rows of memory cells;

a calibration fuse bank configured to be programmed with at least one row address corresponding to one row of the rows of the memory array, the one row not being used by the memory array during operation of the memory device.

43. A memory module, comprising:

a plurality of memory devices, each memory device of the plurality of memory devices having a memory array, the memory array including a plurality of memory cells arranged in rows and columns and further including a plurality of redundant rows of memory cells;

at least one memory device of the plurality of memory devices including a calibration fuse bank, the calibration fuse bank configured to be programmed with at least one row address corresponding to one row of the rows of the memory array of the at least one memory device, the one row not being used by the memory array during operation of the at least one memory device.

44. A computer system, comprising:

a memory controller;

a plurality of memory devices in electrical communication with the memory controller, each memory device of the plurality of memory devices having a memory array, the memory array including a plurality of memory cells arranged in rows and columns and further including a plurality of redundant rows of memory cells;

at least one memory device of the plurality of memory devices including a calibration fuse bank, the calibration fuse bank configured to be programmed with at least one row address corresponding to one row of the rows of the memory array of the at least one memory device, the one row not being used by the memory array during operation of the at least one memory device of the computer system.

45. A memory device, comprising:

a memory array including a plurality of memory cells arranged in rows and columns and further including a plurality of redundant rows of memory cells;

at least one fuse bank programmed with row addresses corresponding to redundant rows of the plurality of redundant rows used by the memory array for repair, the memory device configured to identify at least one nonblown fuse in the at least one fuse bank corresponding to a redundant row not being used by the memory array and to address the redundant row not being used by the memory array during calibration.

46. A memory module, comprising:

a plurality of memory devices, each memory device of the plurality of memory devices having a memory array, the memory array including a plurality of memory cells arranged in rows and columns and further including a plurality of redundant rows of memory cells;

at least one memory device of the plurality of memory devices including at least one fuse bank, the at least one fuse bank programmed with row addresses corresponding to redundant rows of the plurality of redundant rows used by the memory array for repair, the at least one memory device configured to identify at least one nonblown fuse in the at least one fuse bank corresponding to a redundant row not being used by the memory array and to address the redundant row not being used by the memory array of the at least one memory device during calibration.

47. A computer system, comprising:

a memory controller;

a plurality of memory devices in electrical communication with the memory controller, each memory device of the plurality of memory devices having a memory array, the memory array including a plurality of memory cells arranged in rows and columns and further including a plurality of redundant rows of memory cells;

at least one memory device of the plurality of memory devices including at least one fuse bank, the at least one fuse bank programmed with row addresses corresponding to redundant rows of the plurality of redundant rows used by the memory array for repair, the at least one memory device configured to identify at least one nonblown fuse in the at least one fuse bank corresponding to a redundant row not being used by the memory array and to address the redundant row not being used by the memory array of the at least one memory device during calibration.

48. A memory system, comprising:

at least one memory device having a memory array, the memory array including a plurality of memory cells arranged in rows and columns and further including a plurality of redundant rows of memory cells;

a memory controller programmed with at least one row address corresponding to one row of the plurality of rows of the memory array, the memory controller configured to provide the at least one row address to the at least one memory device during calibration.

49. The memory system of claim 48, wherein the one row is not used by the memory array during operation of the at least one memory device.

* * * * *